US010383212B2

(12) United States Patent
Chung et al.

(10) Patent No.: US 10,383,212 B2
(45) Date of Patent: Aug. 13, 2019

(54) PRINTED CIRCUIT BOARD HAVING EMI SHIELDING FUNCTION, METHOD FOR MANUFACTURING THE SAME, AND FLAT CABLE USING THE SAME

(71) Applicant: INKTEC CO., LTD., Ansan-si, Gyeonggi-do (KR)

(72) Inventors: Kwang-Choon Chung, Yongin-si (KR); Byung Woong Moon, Siheung-si (KR)

(73) Assignee: INKTEC CO., LTD., Ansan-si, Gyeonggi-Do (KR)

( * ) Notice: Subject to any disclaimer, the term of this patent is extended or adjusted under 35 U.S.C. 154(b) by 0 days.

(21) Appl. No.: 16/025,641

(22) Filed: Jul. 2, 2018

(65) Prior Publication Data
US 2019/0008033 A1    Jan. 3, 2019

(30) Foreign Application Priority Data

Jul. 3, 2017  (KR) .................. 10-2017-0084415

(51) Int. Cl.
*H05K 9/00*       (2006.01)
*H05K 1/02*       (2006.01)
*H01R 12/79*      (2011.01)
*H05K 1/11*       (2006.01)
(Continued)

(52) U.S. Cl.
CPC .............. *H05K 1/0219* (2013.01); *H01B 7/08* (2013.01); *H05K 1/028* (2013.01); *H05K 1/115* (2013.01); *H05K 1/118* (2013.01); *H05K 3/422* (2013.01); *H05K 3/425* (2013.01); *H05K 9/0098* (2013.01); *H01R 12/79* (2013.01); *H05K 2201/0154* (2013.01); *H05K 2201/0715* (2013.01); *H05K 2201/093* (2013.01); *H05K 2201/09609* (2013.01); *H05K 2201/09681* (2013.01); *H05K 2203/072* (2013.01)

(58) Field of Classification Search
CPC .... H01B 11/06; H05K 1/0219; H05K 9/0098; H05K 2201/0715
See application file for complete search history.

(56) References Cited

U.S. PATENT DOCUMENTS 8,440,911 B2 * 5/2013 Takamatsu ........... H01B 7/0861
174/117 F
10,102,946 B1 * 10/2018 McNutt ............... H05K 9/0098
(Continued)

FOREIGN PATENT DOCUMENTS

KR        10-1219357 B1    1/2013

*Primary Examiner* — Hung V Ngo
(74) *Attorney, Agent, or Firm* — Saliwanchik, Lloyd & Eisenschenk

(57) ABSTRACT

The present disclosure relates a printed circuit board having an EMI shielding function. In an example embodiment, the printed circuit board includes a substrate, a signal unit disposed on the substrate, a ground unit disposed in parallel with the signal unit, an insulation layer disposed above the substrate and covering the signal unit and the ground unit, an EMI shielding layer disposed on the insulation layer and under the substrate, respectively, and a shielding bridge passing through the substrate and the insulation layer at opposite sides of the signal unit and electrically connecting the EMI shielding layer disposed on the insulation layer to the EMI shielding layer disposed under the substrate.

18 Claims, 20 Drawing Sheets

(51) Int. Cl.
*H01B 7/08* (2006.01)
*H05K 3/42* (2006.01)

(56) References Cited

U.S. PATENT DOCUMENTS

| | | | | |
|---|---|---|---|---|
| 2003/0188889 | A1* | 10/2003 | Straub | H05K 1/0219 |
| | | | | 174/262 |
| 2011/0051381 | A1* | 3/2011 | Sugiyama | H01R 12/62 |
| | | | | 361/749 |
| 2014/0034357 | A1* | 2/2014 | Lee | H05K 1/0242 |
| | | | | 174/251 |
| 2015/0271959 | A1* | 9/2015 | Chen | H05K 9/0024 |
| | | | | 361/760 |
| 2015/0319847 | A1* | 11/2015 | Kim | H05K 1/0216 |
| | | | | 174/264 |
| 2017/0303446 | A1* | 10/2017 | Johansson | H05K 9/0018 |
| 2018/0048047 | A1* | 2/2018 | Lee | H01P 7/082 |
| 2018/0180828 | A1* | 6/2018 | Zhao | G02B 6/4277 |

* cited by examiner

PRINTED CIRCUIT BOARD HAVING EMI SHIELDING FUNCTION, METHOD FOR MANUFACTURING THE SAME, AND FLAT CABLE USING THE SAME

CROSS-REFERENCE TO RELATED APPLICATION

This application claims the benefit under 35 U.S.C. § 119 of Korean Patent Application No. 10-2017-0084415 filed Jul. 3, 2017, the disclosure of which is herein incorporated by reference in its entirety.

BACKGROUND

Field

The present disclosure relates to a printed circuit board having an EMI shielding function and a method for manufacturing the same, and more particularly to a printed circuit board having an EMI shielding function and a method for manufacturing the same, which can inhibit EMI among a plurality of neighboring signal units.

Description of the Related Art

In general, a flexible printed circuit board (FPCB) is fabricated using a kind of printed circuit technique and is generally used for electrically connecting a rigid printed circuit board (PCB) to another rigid PCB.

The FPCB is generally configured to have a single surfaced structure or a double surfaced structure. The conventional FPCB has been typically used simply for connecting circuits to each other.

When an electrical signal is applied to the FPCB, electromagnetic wave interference (EMI) is generated. The EMI is harmful to human body and generates noises from products employing the FPCB, which is a major cause of quality defects. Accordingly, various methods for avoiding such a problem are being attempted. One of the attempted methods is to employ an EMI shielding film to the FPCB.

FIGS. 1A and 1B illustrate a conventional flexible printed circuit board (FPCB) with an EMI shielding film. Specifically, FIG. 1A is a plan view of the conventional FPCB and FIG. 1B is a cross-sectional view taken along the line A-A' of FIG. 1A.

As illustrated in FIGS. 1A and 1B, the conventional FPCB includes signal lines 14D and ground lines 14G formed on a base film 12, a resin layer 16 provided on the signal lines 14D and the ground lines 14G, and an EMI shielding film 1 disposed on the resin layer 16.

Here, the signal lines 14D are conductive paths for data signal transmission and the ground lines 14G are conductive paths for grounding.

The EMI shielding film 1 includes a polymeric cover film 1a, a conductor layer 1b formed on the coverfilm 1a as a thin metal layer, and a conductive adhesive layer 1c widely coated on one surface of the conductor layer 1b and made of an adhesive resin. The conductive adhesive layer 1c is formed by mixing a conductive metal with a general resin. Silver, nickel or copper may be used as the conductive metal.

In order to allow the EMI shielding film 1 to exert an EMI shielding effect, it is necessary to electrically connect the conductor layer 1b to the ground lines 14G using the conductive adhesive layer 1c. However, since the conductive adhesive layer 1c is hardened when heat and pressure are applied thereto, flexibility of the FPCB may be lowered.

In addition, the EMI generated from the signals lines 14D provided on the base film 12 may interfere with the EMI generated from neighboring signal lines 14D, undesirably generating noises. Particularly, the longer the FPCB, the more the noises generated. In addition, the higher the frequencies of signals passing the signal lines 14D, the more the noises generated. Therefore, high-capacity data, such as high-definition video images, cannot be transmitted at a high speed using a long FPCB.

Prior Art Document

[Patent Document] Korean Patent Registration No. 1219357 (Jan. 9, 2013)

SUMMARY

Accordingly, to solve the aforementioned problems of prior art, an object of the present disclosure is to provide a printed circuit board having an EMI shielding function, which can achieve high-speed signal transmission by emitting EMI and noises generated from a signal unit through an EMI shielding layer and a ground unit, and a method for manufacturing the same.

Another object of the present disclosure is to provide a printed circuit board having an EMI shielding function, which can inhibit EMI among a plurality of neighboring signal units, and a method for manufacturing the same.

According to an aspect of the present disclosure, the above and other objects of the present disclosure can be achieved by providing a printed circuit board having an EMI shielding function, the printed circuit board including a substrate, a signal unit disposed on the substrate, a ground unit disposed in parallel with the signal unit, an insulation layer disposed above the substrate and covering the signal unit and the ground unit, an EMI shielding layer disposed on the insulation layer and under the substrate, respectively, and a shielding bridge passing through the substrate and the insulation layer at opposite sides of the signal unit and electrically connecting the EMI shielding layer disposed on the insulation layer to the EMI shielding layer disposed under the substrate.

Here, the printed circuit board may further include a ground bridge electrically connecting the EMI shielding layer and the ground unit to each other.

The ground bridge may be formed at at least one of the insulation layer and the substrate.

In addition, the ground bridge may be formed at connectors provided at opposite ends of the printed circuit board and connected to the signal unit and the ground unit, respectively.

In addition, the ground bridge may be formed in a contact hole passing through at least one of the insulation layer and the substrate so as to expose the ground unit.

The shielding bridge may include a plurality of shielding bridges spaced apart from each other along the lengthwise direction of the signal unit.

A distance between the spaced-apart shielding bridges may be set to half or less of the wavelength of EMI generated from the signal unit.

In addition, a distance between the spaced-apart shielding bridges may be set to half or less of the wavelength of externally applied EMI.

The shielding bridge may be formed in a through hole passing through the substrate and the insulation layer.

The ground unit may be disposed at opposite edges of a top surface of the substrate.

The EMI shielding layer may be in the form of a mesh.

Here, a diagonal length of the grid in the mesh may be set to half or less of the wavelength of EMI generated from the signal unit.

In addition, a diagonal length of the grid in the mesh may be set to half or less of the wavelength of externally applied EMI.

According to another aspect of the present disclosure, the above and other objects of the present disclosure can be achieved by providing a flat cable including a printed circuit board having an EMI shielding function, the printed circuit board including a substrate, a signal unit disposed on the substrate, a ground unit disposed in parallel with the signal unit, an insulation layer disposed above the substrate and covering the signal unit and the ground unit, an EMI shielding layer disposed on the insulation layer and under the substrate, respectively, and a shielding bridge passing through the substrate and the insulation layer at opposite sides of the signal unit and electrically connecting the EMI shielding layer disposed on the insulation layer to the EMI shielding layer disposed under the substrate, and connectors provided at opposite ends of the printed circuit board and connected to the signal unit and the ground unit, respectively.

Here, the printed circuit board may further include a ground bridge electrically connecting the EMI shielding layer and the ground unit to each other.

The shielding bridge may include a plurality of shielding bridges spaced apart from each other along the lengthwise direction of the signal unit.

Here, a distance between the spaced-apart shielding bridges is set to half or less of the wavelength of EMI generated from the signal unit.

In addition, a distance between the spaced-apart shielding bridges may be set to half or less of the wavelength of externally applied EMI.

According to still another aspect of the present disclosure, the objects of the present disclosure can be achieved by providing a method for manufacturing a printed circuit board having an EMI shielding function, the method including the steps of forming a signal unit and a ground unit on a top surface of a substrate, forming an insulation layer covering the signal unit and the ground unit on the substrate, hole processing of forming a through hole passing through the substrate and the insulation layer at opposite sides of the signal unit, and forming an EMI shielding layer on the insulation layer and under the substrate, respectively, wherein at the step of forming an EMI shielding layer, the through hole is filled with a conductive material which constitutes the EMI shielding layer to form a shielding bridge connecting the EMI shielding layer disposed on the insulation layer and the EMI shielding layer disposed under the substrate.

At the hole processing step, a contact hole passing through at least one of the insulation layer and the substrate so as to expose the ground unit may be formed, and at the step of forming the EMI shielding layer, the contact hole may be filled with the conductive material which constitutes the EMI shielding layer to form a ground bridge connecting the EMI shielding layer and the ground unit.

In addition, at the hole processing step, a plurality of through holes may be formed along the lengthwise direction of the signal unit.

In addition, a distance between the through holes may be set to half or less of the wavelength of EMI generated from the signal unit.

In addition, a distance between the through holes may be set to half or less of the wavelength of externally applied EMI.

In addition, the step of forming the signal unit and the ground unit may comprise the steps of: forming a metal layer on the top surface of the substrate; and patterning the metal layer.

In addition, at the step of forming the EMI shielding layer, the EMI shielding layer disposed on the insulation layer, the EMI shielding layer disposed under the substrate, the shielding bridge filling the through hole and the ground bridge filling the contact hole, may be formed by electroless plating.

In addition, at the step of forming the EMI shielding layer, an EMI shielding film made of a conductive material may be placed on the insulation layer and under the substrate, respectively, and heat and pressure are applied to the EMI shielding film by hot pressing to allow the through hole and the contact hole to be filled with the conductive material which constitutes the EMI shielding film.

In addition, the step of forming the signal unit and the ground unit may comprise the steps of: forming a metal seed layer on the top surface of the substrate; plating a metal layer on the metal seed layer; and patterning the metal seed layer and the metal layer.

In addition, the step of forming the signal unit and the ground unit may comprise the steps of: forming a metal seed layer on the top surface of the substrate so as to correspond to the signal unit and the ground unit; and plating a metal layer on the metal seed layer.

In addition, at the step of forming the metal seed layer, the metal seed layer may be formed by printing a conductive paste on a flexible substrate.

In addition, the step of forming the EMI shielding layer may include the steps of forming an upper metal seed layer on a top surface of the insulation layer and forming a lower metal seed layer on a bottom surface of the substrate, coating a metal seed film on inner walls of the through hole and the contact hole, and plating a conductive material on surfaces of the metal seed layer and the metal seed film.

In addition, the step of forming the EMI shielding layer may further include a step of patterning the conductive material plated on the surface of the metal seed layer.

After the step forming the metal seed layer, a step of forming a protective film on surfaces of the upper metal seed layer and the lower metal seed layer may be performed, and after the step of coating the metal seed layer on the inner wall of the contact hole, a step of removing the protective film may be performed.

At the step of forming the signal unit and the ground unit, a post may be formed at a position of the top surface of the substrate, where the through hole is to be formed.

At the step of forming the post, the post may be formed in a pillar shape and a plurality of posts may be formed and arranged to be spaced apart from each other along the lengthwise direction of the signal unit.

Here, a distance between the spaced-apart posts may be set to half or less of the wavelength of EMI generated from the signal unit.

In addition, a distance between the spaced-apart posts may be set to half or less of the wavelength of externally applied EMI.

At the hole processing step, the through hole passing through the substrate and the insulation layer at a position corresponding to the post may be formed to then expose top and bottom surfaces of the post.

In addition, at the step of forming the EMI shielding layer, a shielding bridge electrically connecting the EMI shielding layer disposed on the insulation layer and the EMI shielding layer disposed under the substrate to the post may be formed while filling the through hole with a conductive material for forming the EMI shielding layer.

According to the present disclosure, the printed circuit board having an EMI shielding function and the method for manufacturing the same are provided, thereby achieving high-speed signal transmission by emitting EMI and noises generated from a signal unit through an EMI shielding layer and a ground unit.

In addition, according to the present disclosure, the printed circuit board having an EMI shielding function and the method for manufacturing the same are provided, thereby inhibiting EMI among a plurality of neighboring signal units.

As described above, the present disclosure provides a printed circuit board having an EMI shielding function and a method for manufacturing the same, which can shield not only the internally generated EMI and noises but also the externally applied EMI and noises.

DETAILED DESCRIPTION

Figure 1A:
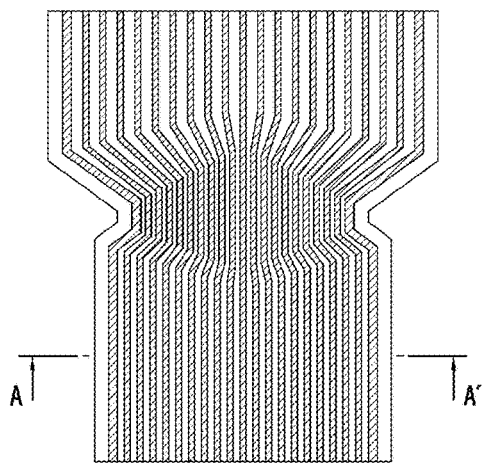
FIGS. 1A and 1B illustrate a conventional flexible printed circuit board (FPCB) with an EMI shielding film.
Figure 1B:
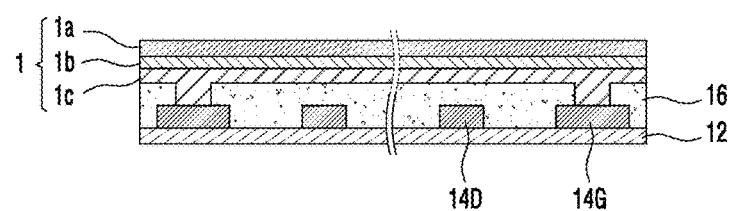

Before describing the present disclosure, it is noted that the same functional elements will be denoted by the same reference numerals in various embodiments to then be representatively described in a first embodiment and the description of other embodiments will focus on only elements different from those of the first embodiment.

Hereinafter, a printed circuit board having an EMI shielding function according to a first embodiment of the present disclosure will be described in detail with reference to the accompanying drawings.

Figure 2:
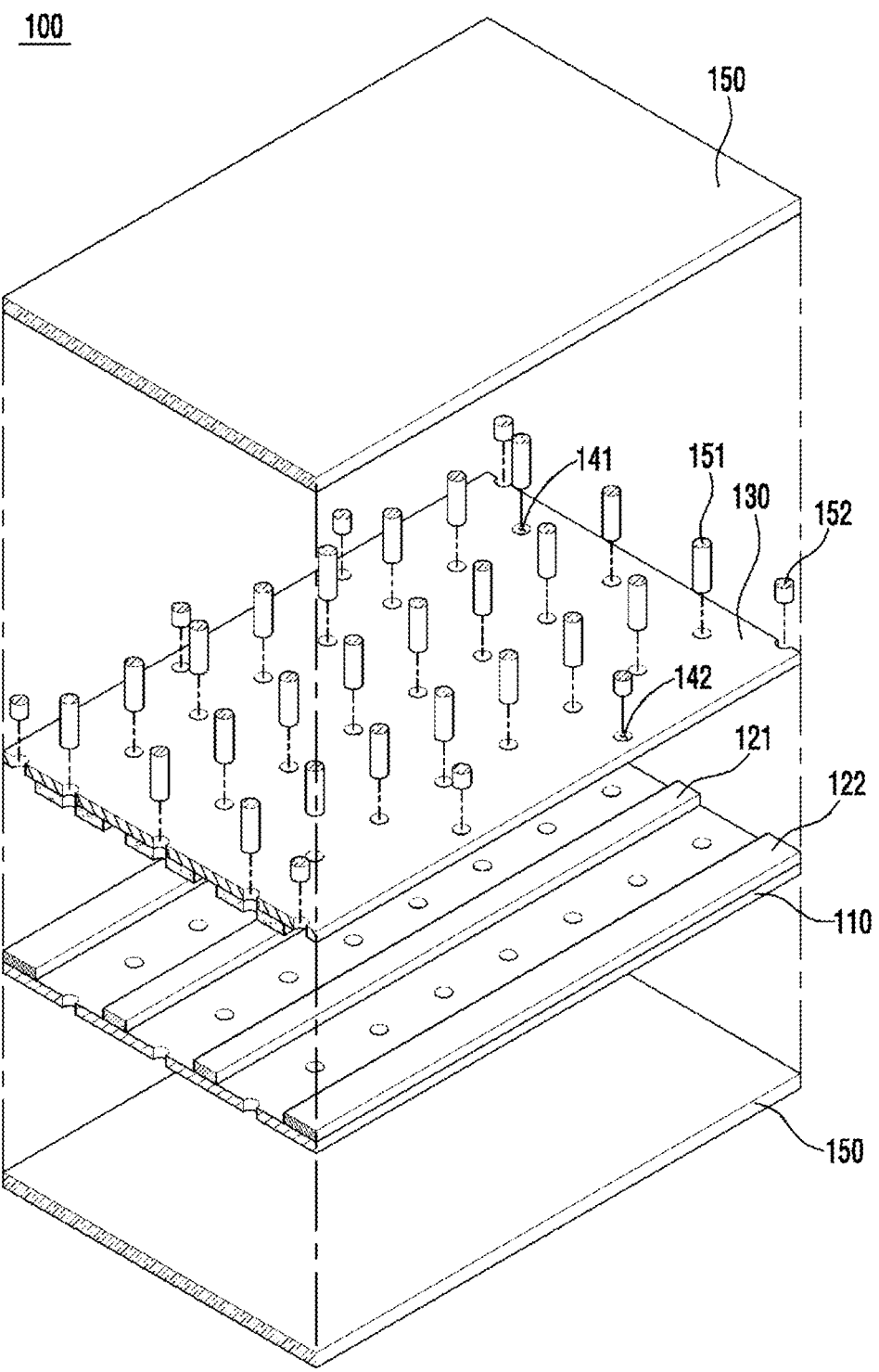
FIG. 2 is an exploded perspective view of a printed circuit board having an EMI shielding function according to a first embodiment of the present disclosure.
Figure 3:
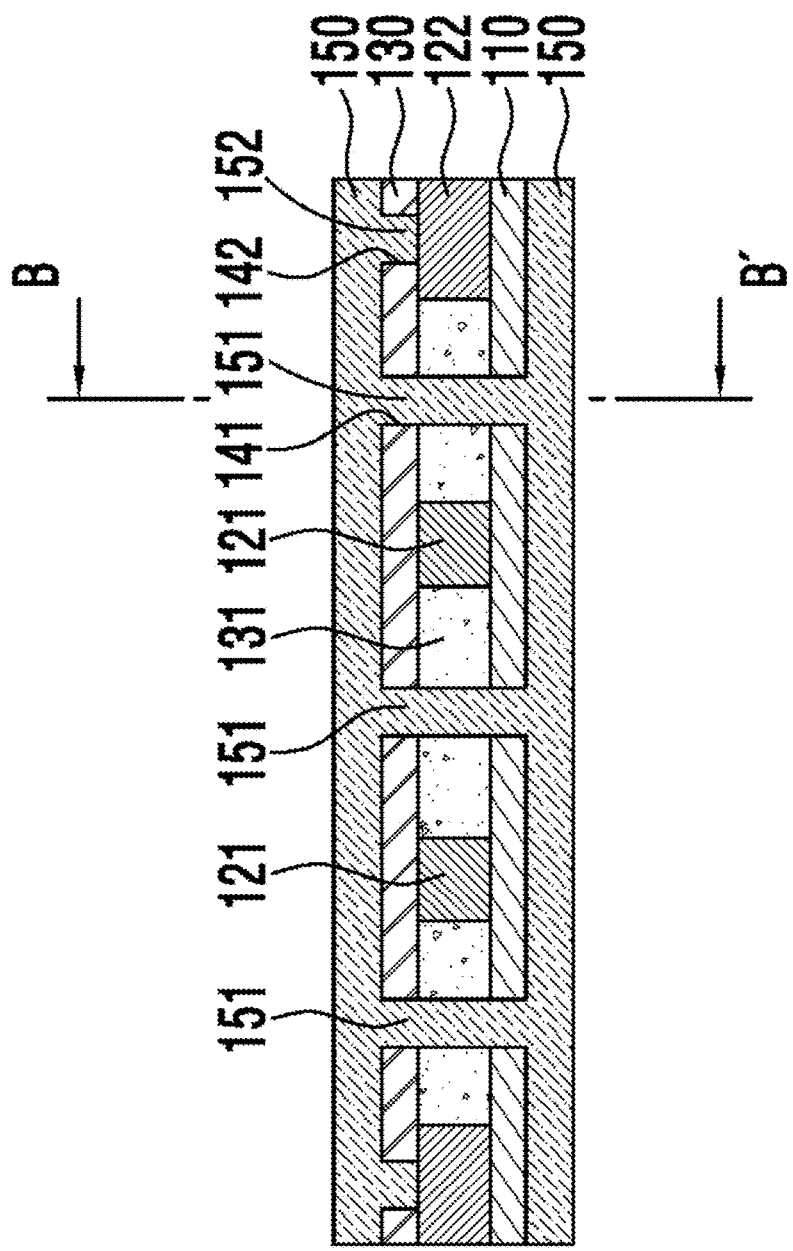
FIG. 3 is a cross-sectional view of the printed circuit board having an EMI shielding function according to a first embodiment of the present disclosure.
Figure 4:
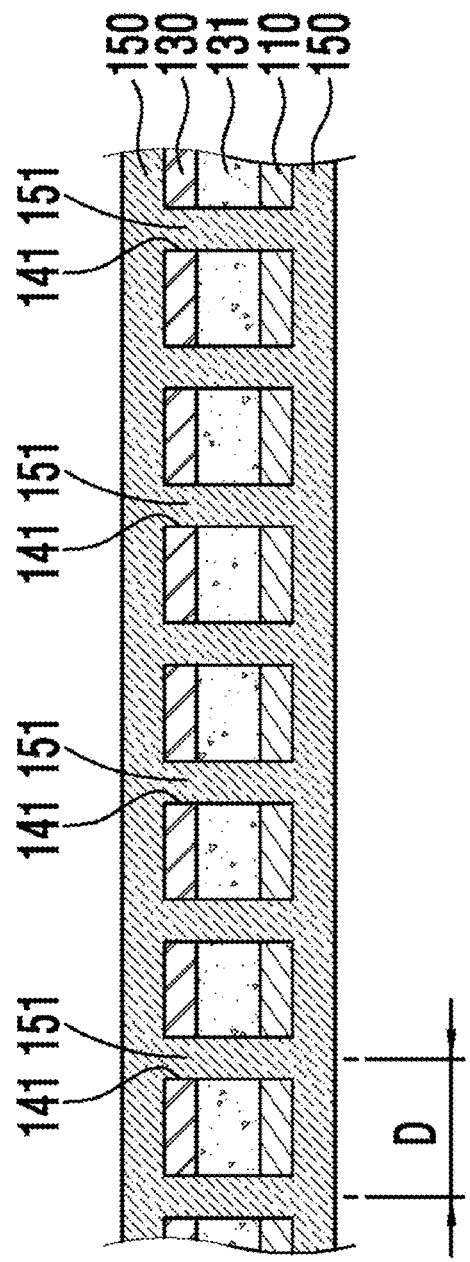
FIG. 4 is a cross-sectional view taken along the line B-B' of FIG. 3.

FIG. 2 is an exploded perspective view of a printed circuit board having an EMI shielding function according to a first embodiment of the present disclosure, and FIG. 3 is a cross-sectional view of the printed circuit board having an EMI shielding function according to a first embodiment of the present disclosure, FIG. 4 is a cross-sectional view taken along the line B-B' of FIG. 3.

First, as shown in FIGS. 2 to 4, the printed circuit board having an EMI shielding function according to the first embodiment of the present disclosure includes a substrate 110, a signal unit 121, a ground unit 122, an insulation layer 130, a through hole 141, a contact hole 142, an EMI shielding layer 150, a shielding bridge 151 and a ground bridge 152.

The substrate 110 becomes a base material of a flexible printed circuit board and may be made of a easily bendable film, like a polyimide film.

The signal unit 121 is made of a highly conductive material, such as copper (Cu), and includes a plurality of signal units provided on a top surface of the substrate 110 to then be aligned in parallel.

The ground unit 122 is made of the same material with the signal unit 121 and is arranged at opposite edges of the top surface of the substrate 110 to be parallel with the signal unit 121.

The insulation layer 130 is laminated on the top surface of the substrate 110 to protect the signal unit 121 and the ground unit 122 formed on the top surface of the substrate 110 to then cover the signal unit 121 and the ground unit 122. An adhesive 131 may be applied to a surface of the insulation layer 130 facing the substrate 110 and the insulation layer 130 may be adhered to the top surface of the substrate 110.

The through hole 141 may be formed while passing through the substrate 110 and the insulation layer 130 at opposite sides of the signal unit 121, and a plurality of through holes 141 are formed and spaced a constant distance D apart from each other along the lengthwise direction of the signal unit 121. In particular, the distance D between the spaced-apart through holes 141 is set to half or less of the wavelength of EMI generated from the signal unit 121 or to half or less of the wavelength of externally applied EMI.

The contact hole 142 may be formed while passing through at least one of the insulation layer 130 and the substrate 110. In the example of the present disclosure, the contact hole 142 will be described by way of example with regard to a via hole passing through the insulation layer 130 to expose a top surface of the ground unit 122. In addition, the contact hole 142 includes a plurality of contact holes to be spaced apart from one another along the ground unit 122, thereby allowing the EMI shielding layer 150 to be electrically connected to the ground unit 122 at a plurality of locations by the ground bridge 152 formed in the contact hole 142. A distance between contact holes 142 can be determined by an electrical resistance value of the EMI shielding layer 150. When the EMI shielding layer 150 has a relatively large electrical resistance value, the distance between the contact holes 142 may be reduced, and when the EMI shielding layer 150 has a relatively small electrical resistance value, the distance between the contact holes 142 may be increased. Meanwhile, the contact hole 142 can be formed as a via hole passing through the substrate 110. Additionally, the contact hole 142 can also be formed as a through hole passing through the insulation layer 130, the ground unit 122 and the substrate 110 and then exposing the ground unit 122 protected by the insulation layer 130 and the substrate 110 or a through hole passing through the insulation layer 130 and the substrate 110 and then exposing side surfaces of the ground unit 122 within the contact hole 142.

The EMI shielding layer 150 is disposed on the insulation layer 130 and under the substrate 110, respectively, the upper and lower EMI shielding layers 150 are electrically connected by the shielding bridge 151, and the EMI shielding layer 150 and the ground unit 122 are electrically connected by the ground bridge 152.

The EMI shielding layer 150 may be formed by an EMI shielding film made of a thermoplastic conductive material. If a pressure is applied to the EMI shielding film in a state in which the EMI shielding film is heated at a temperature slightly lower than its melting point to then be softened, the conductive material which constitutes the EMI shielding film is inserted into the through hole 141 and the contact hole 142, thereby forming the shielding bridge 151 electrically connecting the EMI shielding layer 150 disposed on the insulation layer 130 and the EMI shielding layer 150 disposed under the substrate to each other, and the ground bridge 152 electrically connecting the EMI shielding layer disposed on the insulation layer 130 and the ground unit 122 to each other. In order to apply heat and pressure to the EMI shielding film, a hot pressing process may be employed for simultaneously applying heat energy and pressure to the EMI shielding film.

In detail, the shielding bridges 151 filling the through hole 141 are positioned at opposite sides of the signal unit 121, respectively, and the shielding bridges 151 are spaced apart from each other by a distance smaller than or equal to half of the wavelength of EMI generated from the signal unit 121, so that the EMI generated from the signal unit 121 cannot pass a space between the shielding bridges 151, thereby providing a Faraday cage effect. In other words, since the shielding bridge 151 disposed at opposite sides of the signal unit 121 acts as an EMI shielding film, an EMI shielding effect, where the EMI generated from the signal unit 121 is shielded by the shielding bridges 151 enclosing the signal unit 121, can be provided simply by laminating the EMI shielding layer 150 only on top and bottom portions of the signal unit 121.

Figure 5:
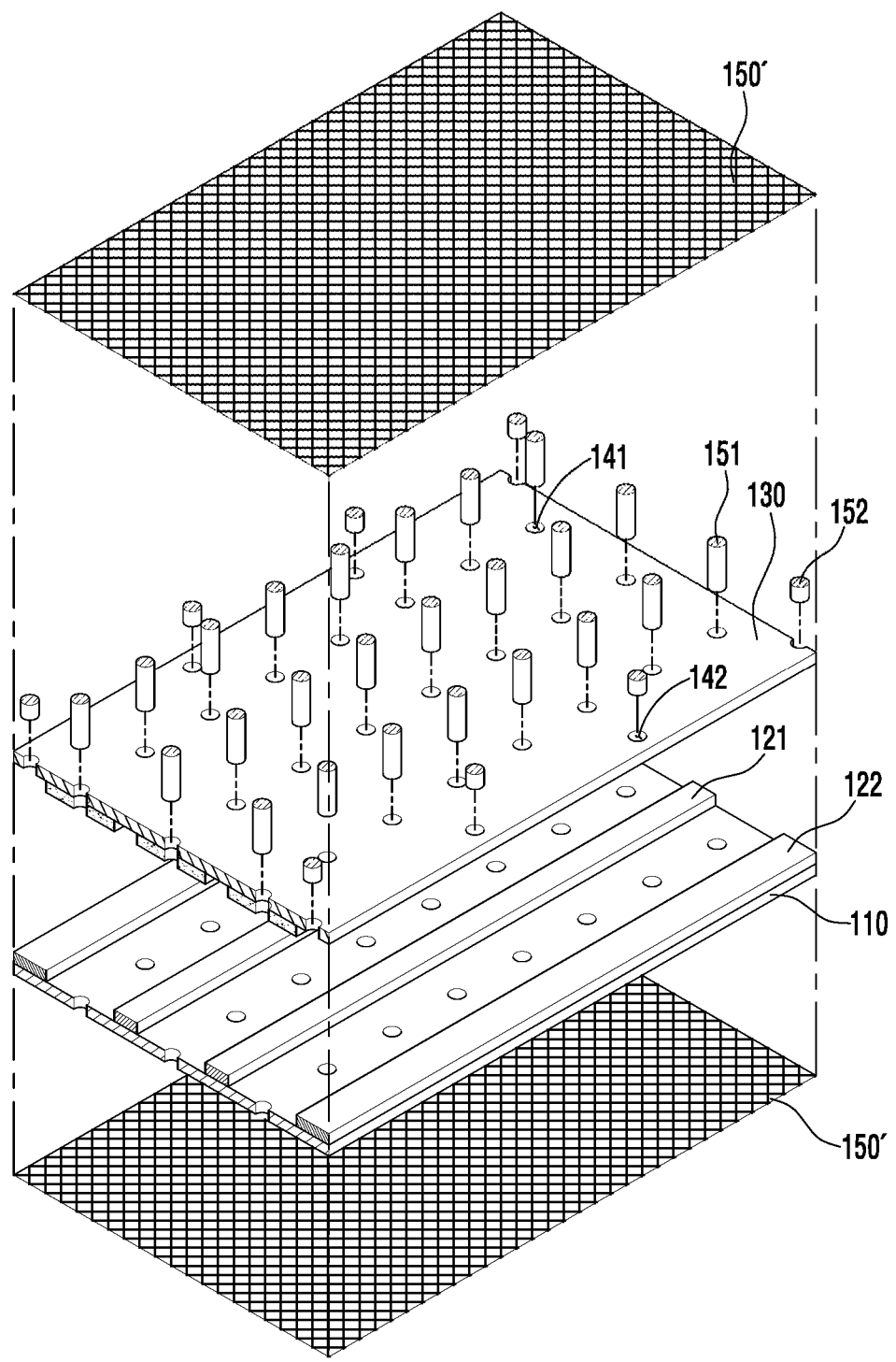
FIG. 5 is an exploded perspective view of a printed circuit board having an EMI shielding function according to a second embodiment of the present disclosure.

FIG. 5 is an exploded perspective view of a printed circuit board having an EMI shielding function according to a second embodiment of the present disclosure.

As shown in FIG. 5, the printed circuit board having an EMI shielding function according to the second embodiment of the present disclosure is different from the printed circuit board according to the first embodiment of the present disclosure in that an EMI shielding layer 150' disposed on an insulation layer 130 and an EMI shielding layer 150' disposed under a substrate are in the form of a mesh, respectively.

In particular, the EMI shielding layer 150' in the form of a mesh having a diagonal length of the grid in the mesh set to half or less of the wavelength of EMI generated from a signal unit 121 or to half or less of the wavelength of externally applied EMI. Therefore, the EMI generated from the signal unit 121 can be inhibited from being emitted to the outside through the EMI shielding layer 150' or the external EMI from being induced into the signal unit 121 through the EMI shielding layer 150' owing to the Faraday cage effect.

Specifically, in a case where the EMI shielding layer 150' is in the form of a mesh, the printed circuit board advantageously can have improved flexibility, compared to a case where the EMI shielding layer 150' is shaped of a general plate.

Meanwhile, since other elements except the EMI shielding layer 150' are the same with those of the first embodiment, detailed descriptions thereof will not be repeated.

Figure 6:
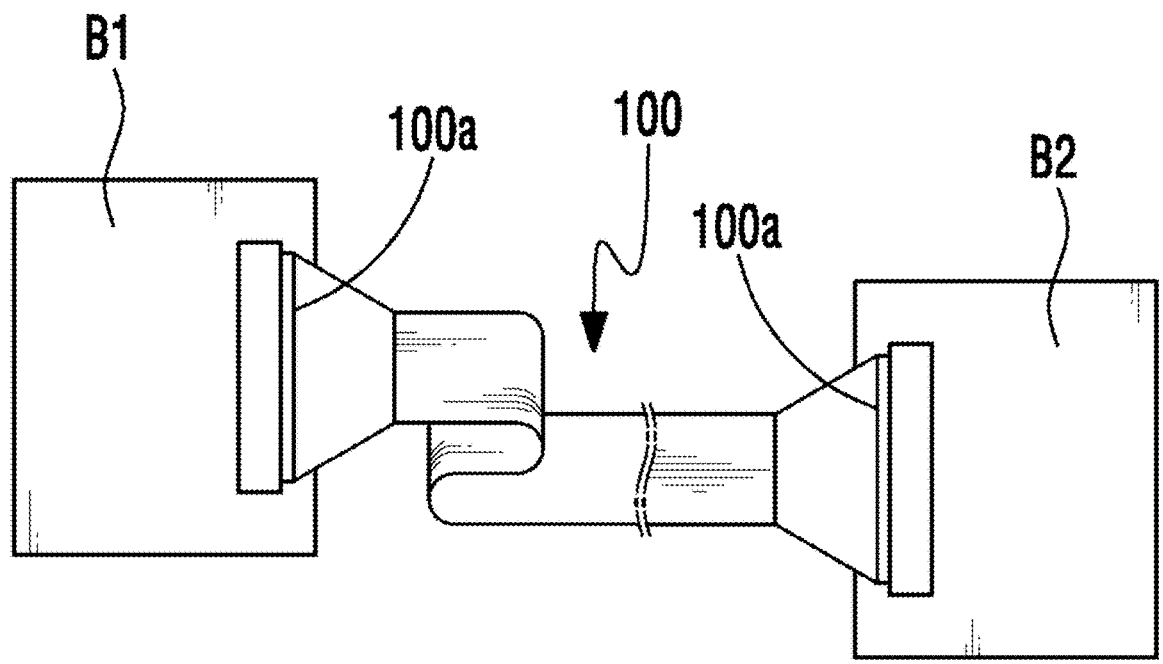
FIG. 6 is a schematic view of a flat cable using the printed circuit board having an EMI shielding function according to the first embodiment of the present disclosure.

As shown in FIG. 6, the flat cable according to the present disclosure may be configured such that the flexible printed circuit board 100 shown in FIG. 2 and FIG. 6 is provided and connectors 100a which is to be connected to a signal unit 121 and a ground unit 122 are provided at opposite ends of the flexible printed circuit board 100.

The flat cable allows connectors 100a provided at opposite ends of the flexible printed circuit board 100 to be coupled to a first substrate B1 and a second substrate B2 moving relative to each other to allow the first substrate B1 and the second substrate B2 to be electrically connected by the flexible printed circuit board 100.

In other words, according to the present embodiment, a plurality of signal units 121 provided on the flexible printed circuit board 100 are independently protected by the EMI shielding layer 150, it is possible to inhibit noises from being mixed with signals transmitted through the flexible printed circuit board 100 even by using an elongated flexible flat cable or a flexible flat cable for high-speed transmission of high-capacity signals, such as video signals.

FIGS. 7A-7E illustrate cross-sectional views of various processing steps in a method for manufacturing a printed circuit board having an EMI shielding function according to a first embodiment of the present disclosure.

As shown in FIGS. 7A-7E, the method for manufacturing the printed circuit board having an EMI shielding function according to the first embodiment of the present disclosure comprises the steps of: forming a metal layer (S110); forming a signal unit and a ground unit (S120); forming an insulation layer (S130); hole processing (S140); and forming an EMI shielding layer (S150).

Figure 7A:
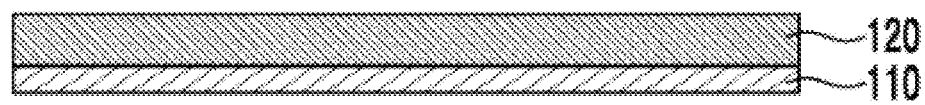
FIGS. 7A-7E illustrate cross-sectional views of various processing steps in a method for manufacturing a printed circuit board having an EMI shielding function according to a first embodiment of the present disclosure.

At the step of forming the metal layer (S110), as shown in FIG. 7A, the metal layer 120 made of, e.g., copper (Cu), is laminated on an easily bendable insulating substrate 110 made of, e.g., polyimide. The step of forming the metal layer (S110) may be replaced by a step of preparing a flexible copper cladding laminate (FCCL) provided in a state in which the metal layer 120 is laminated on a top surface of the substrate 110. In this way, the metal layer 120 may be provided by laminating the same on the substrate 110. Alternatively, the metal layer 120 may be provided by coating a metal on the substrate 110 or by plating the metal layer 120 on the substrate 110.

Figure 7B:
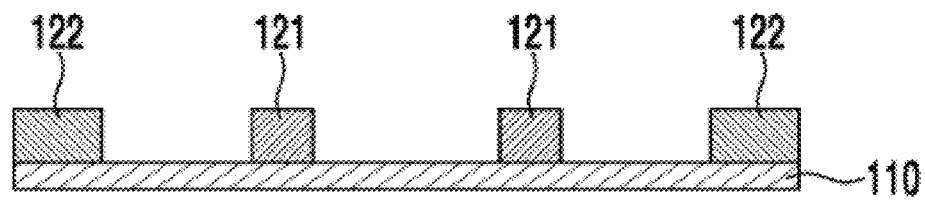

At the step of forming the signal unit 121 and the ground unit 122 (S120), as shown in FIG. 7B, in order to form the signal unit 121 and the ground unit 122 from the metal layer 120, the metal layer 120 is patterned by a photolithography process. In this way, a plurality of signal units 121 and ground units 122 can be formed.

Figure 7C:
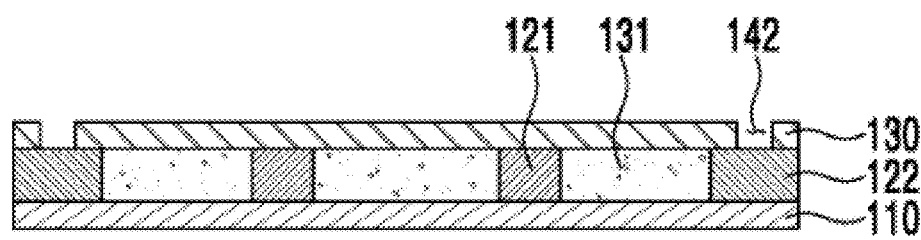

At the step of forming the insulation layer (S130), as shown in FIG. 7C, the insulation layer 130 covering the signal unit 121 and the ground unit 122 is formed on the substrate 110. Here, in order to firmly adhere the insulation layer 130 to the substrate 110, an adhesive 131 may be applied to a surface of the substrate 110 facing the insulation layer 130 the substrate 110, and the insulation layer 130 may be adhered to the top surface of substrate 110 by hot pressing.

Figure 7D:
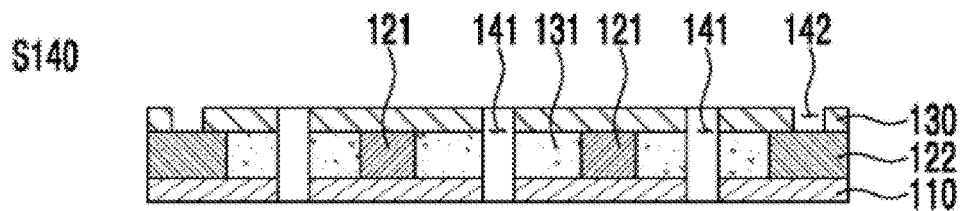

At the hole processing step (S140), as shown in FIG. 7D, a through hole 141 passing through the substrate 110 and the insulation layer 130 at opposite sides of the signal unit 121, is formed, and a contact hole 142 passing through at least one of the insulation layer 130 and the substrate 110 to expose the ground unit 122, is formed. Here, the through hole 141 may include a plurality of through holes formed along the lengthwise direction of the signal unit 121, and a distance between the through holes 141 may be set to half or less of the wavelength of EMI generated from the signal unit 121.

Meanwhile, in a case where the contact hole 142 is formed in the insulation layer 130, at the step of forming the insulation layer (S130), the insulation layer 130 having a prefabricated contact hole 142 is placed on a top surface of the substrate 110, and the insulation layer 130 and the substrate 110 are aligned at their bonding positions. In such a state, the insulation layer 130 may be bonded to the substrate 110. As described above, in the case where the contact hole 142 is prefabricated in the insulation layer 130, precisely controlling of a processing depth of the contact hole 142 is not needed at the hole processing step (S140).

Figure 7E:
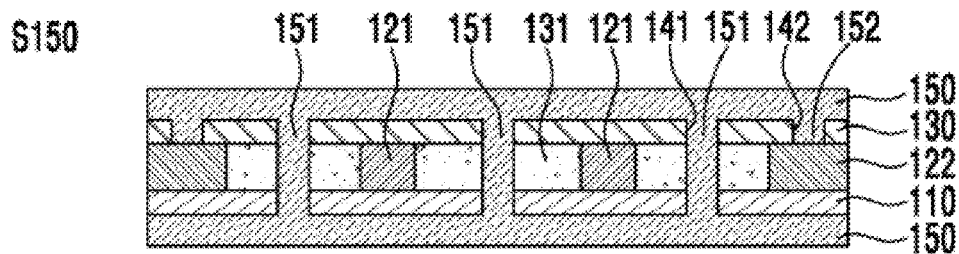

At the step of forming the EMI shielding layer (S150), as shown in FIG. 7E, an EMI shielding film made of a thermoplastic conductive material is placed on the insulation layer 130 and under the substrate 110, respectively, and a pressure is applied to the EMI shielding film in a state in which the EMI shielding film is heated at a temperature slightly lower than its melting point to then be softened. Then, the shielding bridge 151 electrically connecting the EMI shielding layer 150 disposed on the insulation layer 130 and the EMI shielding layer 150 disposed under the substrate to each other, and the ground bridge 152 electrically connecting the EMI shielding layer 150 disposed on the insulation layer 130 and the ground unit 122 to each other, are formed while the through hole 141 and the contact hole 142 are filled with the conductive material which constitutes the EMI shielding film. At the step of forming the EMI shielding layer (S150), a hot pressing process in which a pressure is applied to the EMI shielding film while heating the EMI shielding film, may be employed.

Meanwhile, this embodiment of the present disclosure has been described by way of example with regard to a case where an EMI shielding film is placed on the insulation layer 130 and under the substrate 110, and the EMI shielding layer 150, the shielding bridge 151 and the ground bridge 152 are formed by hot pressing. Alternatively, it is also possible to form the EMI shielding layer 150 disposed on the insulation layer 130, the EMI shielding layer 150 disposed under the substrate 100, the shielding bridge 151 filling the through hole 141 and the ground bridge 152 filling the contact hole 142 by forming an electroless plating on the entire external surface of the printed circuit board to a required thickness using an electroless plating process.

FIGS. 8A-8D and FIGS. 9A-9D illustrate cross-sectional views of various processing steps in a method for manufacturing a printed circuit board having an EMI shielding function according to a second embodiment of the present disclosure.

As shown in FIGS. 8A-8D and FIGS. 9A-9D, the method for manufacturing the printed circuit board having an EMI shielding function according to the second embodiment of the present disclosure comprises the steps of: forming a metal layer (S210); forming a signal unit and a ground unit (S220); forming an insulation layer (S230); forming an upper metal seed layer (S240); forming a lower metal seed layer (S250); hole processing (S260); forming an EMI shielding layer (S270); and laminating a cover layer (S280).

Figure 8A:
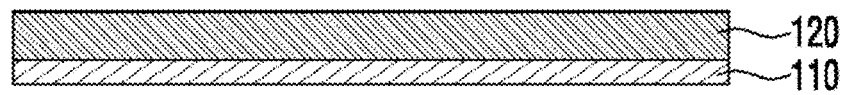
FIGS. 8A-8D and FIGS. 9A-9D illustrate cross-sectional views of various processing steps in a method for manufacturing a printed circuit board having an EMI shielding function according to a second embodiment of the present disclosure.

At the step of forming the metal layer (S210), as shown in FIG. 8A, a metal layer 120 made of, e.g., copper (Cu), is laminated on an easily bendable insulating substrate 110 made of, e.g., polyimide. The step of forming the metal layer (S210) may be replaced by a step of preparing a flexible copper cladding laminate (FCCL) provided in a state in which the metal layer 120 is laminated on a top surface of the substrate 110. In this way, the metal layer 120 may be provided by laminating the same on the substrate 110. Alternatively, metal layer 120 may be provided by coating a metal on the substrate 110 or by plating the metal layer 120 on the substrate 110.

Figure 8B:
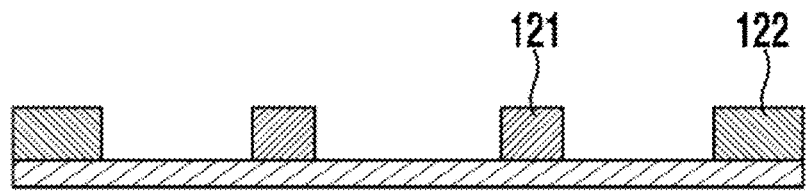

At the step of forming the signal unit 121 and the ground unit 122 (S220), as shown in FIG. 8B, in order to form the signal unit 121 and the ground unit 122 from the metal layer 120, the metal layer 120 may be patterned by a photolithography process. In this way, a plurality of signal units 121 and ground units 122 can be formed.

Figure 8C:
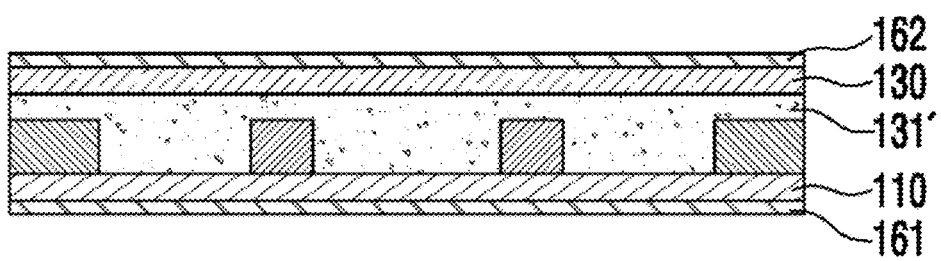

At the step of forming the insulation layer (S230), as shown in FIG. 8C, the insulation layer 130 is adhered to the top surface of the substrate 110 using an adhesive 131' in the form of, e.g., a bonding sheet. The adhesive 131' may be applied between the insulation layer 130 and the substrate 110 by hot pressing.

Figure 8D:
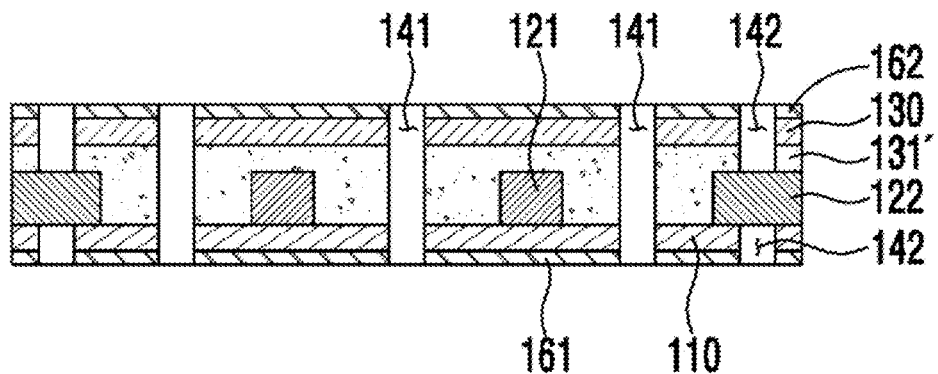

At the step of forming the upper metal seed layer (S240), as shown in FIG. 8D, the upper metal seed layer 162 for electroplating the EMI shielding layer 150 is formed on a top surface of the insulation layer 130. The upper metal seed layer 162 may be made of a silver (Ag) material having high electrical conductivity and may be formed by gravure coating, screen printing, slot die coating, spin coating or deposition.

Meanwhile, for simplifying the process, this embodiment of the present disclosure has been described by way of example with regard to a case where a flexible seed clad laminate (FSCL) having the metal seed layer 162 formed on the top surface of the insulation layer 130 is prepared in advance, the insulation layer 130 of the FSCL is bonded to the substrate 110 using the adhesive 131' in the form of, e.g., a bonding sheet, thereby simultaneously performing the upper metal seed layer forming step (S240) and the insulation layer forming step (S230), but aspects of the present disclosure are not limited thereto.

At the step of forming the lower metal seed layer (S250), as shown in FIG. 8C, the lower metal seed layer 161 for electroplating the EMI shielding layer 150 is formed on a bottom surface of the substrate 110. The lower metal seed layer 161 may be made of a silver (Ag) material having high electrical conductivity and may be formed by gravure coating, screen printing, slot die coating, spin coating or deposition.

At the hole processing step (S260), as shown in FIG. 8D, a through hole 141 passing through the upper metal seed layer 162, the insulation layer 130, the adhesive 131', the substrate 110 and the lower metal seed layer 161 at opposite sides of the signal unit 121, is formed, and a contact hole 142 passing through the upper metal seed layer 162, the insulation layer 130 and the adhesive 131' at a position corresponding to the ground unit 122 to expose the ground unit 122, is formed.

Here, the through hole 141 may include a plurality of through holes spaced apart from one another along the lengthwise direction of the signal unit 121, and a distance between the through holes 141 may be set to half or less of the wavelength of EMI generated from the signal unit 121.

Meanwhile, this embodiment of the present disclosure has been described by way of example with regard to a case where the contact hole 142 is formed to a depth in which surfaces of the ground unit 122 are exposed at top and bottom portions, but aspects of the present disclosure are not limited thereto. For processing convenience, the contact hole 142 may also be formed to a depth so as to completely pass through the printed circuit board, including the ground unit 122. In order to inhibit the ground unit 122 from being damaged, it is also possible to expose side surfaces of the ground unit 122 within the contact hole 142 by adjusting the position of the contact hole 142.

Figure 9A:
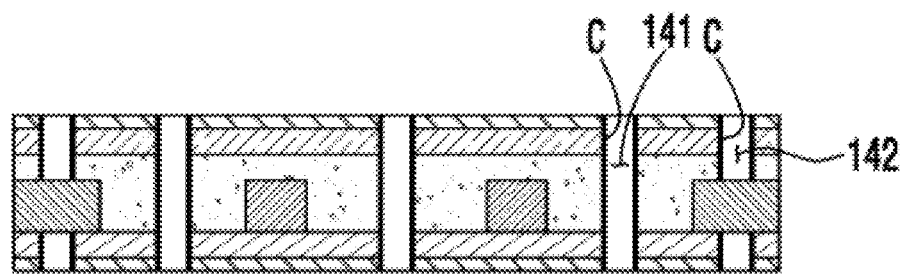
Figure 9B:
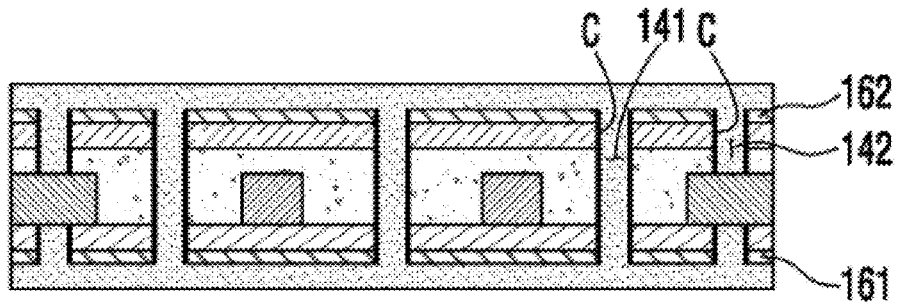
Figure 9C:
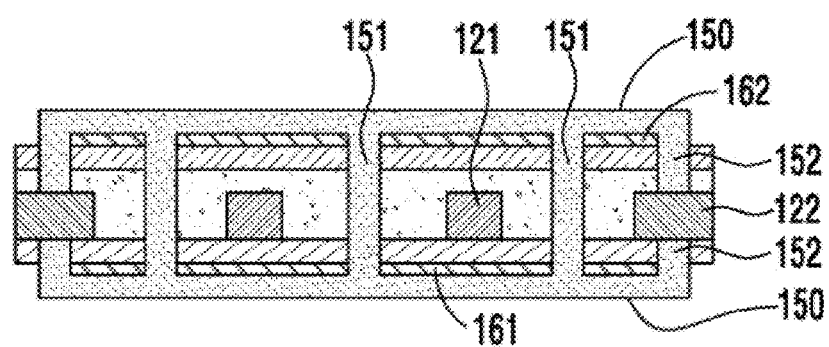

The step of forming the EMI shielding layer (S270) comprises the steps of: forming a metal seed film (C) on inner walls of the through hole 141 and the contact hole 142 (S271), as shown in FIG. 9A; plating a conductive material, such as copper (Cu), on exposed surfaces of the upper metal seed layer 162, the lower metal seed layer 161 and the metal seed film (C) (S272), as shown in FIG. 9B; and patterning the conductive material for removing the EMI shielding layer 150 and the metal seed layers 161 and 162, which are formed at unnecessary portions (S273), as shown in FIG. 9C.

At the step of forming the metal seed film (C) (S271), as shown in FIG. 9A, the metal seed film (C) is formed on inner walls of the through hole 141 and the contact hole 142 by a black hole process, electroless plating, or screen printing. Next, at the step of plating the conductive material (S272), as shown in FIG. 9B, the EMI shielding layer 150 having a desired thickness is formed on surfaces of the upper metal seed layer 162 and the lower metal seed layer 161 by electroplating, and the through hole 141 and the contact hole 142 having the metal seed film (C) formed therein are filled with the conductive material, thereby forming the shielding bridge 151 and the ground bridge 152.

In other words, the upper EMI shielding layer 150 and the lower EMI shielding layer 150 are electrically connected to each other by the shielding bridge 151 formed by the same process and the same material with the EMI shielding layer 150, and the EMI shielding layer 150 is electrically connected to the ground unit 122 through the ground bridge 152 formed by the same process and the same material with the EMI shielding layer 150. Therefore, the bendability degradation problem with a connection structure of the ground unit and the EMI shielding film of can be solved using a thermally curable resin based adhesive, like in the related art.

Figure 9D:
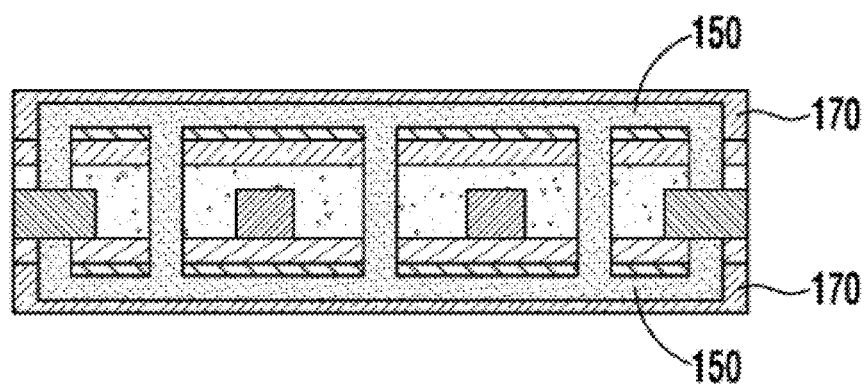

At the step of laminating the cover layer (S280), as shown in FIG. 9D, in order to protect the EMI shielding layer 150, the cover layer 170 made of an insulating material is laminated on a top surface of the upper EMI shielding layer 150 and a bottom surface of the lower EMI shielding layer 150, respectively.

FIGS. 10A-10F and FIGS. 11A-11F illustrate cross-sectional views of various processing steps in a method for manufacturing a printed circuit board having an EMI shielding function according to a third embodiment of the present disclosure.

As shown in FIGS. 10A-10F and FIGS. 11A-11F, the method for manufacturing a printed circuit board having an EMI shielding function according to the third embodiment of the present disclosure comprises the steps of: forming a metal layer (S310); forming a lower metal seed layer (S320); forming a lower protective film (S330); forming a signal unit and a ground unit (S340); forming an insulation layer (S350); forming an upper metal seed layer (S360); forming an upper protective film (S370); hole processing (S380); removing the protective films (S390); forming an EMI shielding layer (S400); and forming a cover layer (S410).

Figure 10A:
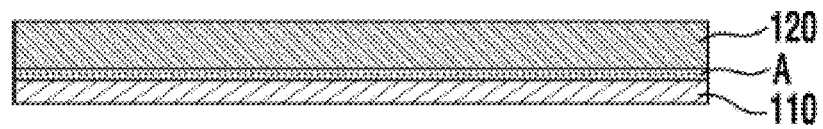
FIGS. 10A-10F and FIGS. 11A-11F illustrate cross-sectional views of various processing steps in a method for manufacturing a printed circuit board having an EMI shielding function according to a third embodiment of the present disclosure.

At the step of forming the metal layer (S310), as shown in FIG. 10A, the metal layer 120 made of, e.g., copper (Cu), is laminated on an easily bendable insulating substrate 110 made of, e.g., polyimide. The step of forming the metal layer (S310) may be replaced by a step of preparing a flexible copper cladding laminate (FCCL) provided in a state in which the metal layer 120 is laminated on a top surface of the substrate 110 using a thermally curable adhesive (A). In this way, the metal layer 120 may be provided by laminating the same on the substrate 110. Alternatively, the metal layer 120 may be provided by coating a metal on the substrate 110 or by plating the metal layer 120 on the substrate 110.

Figure 10B:
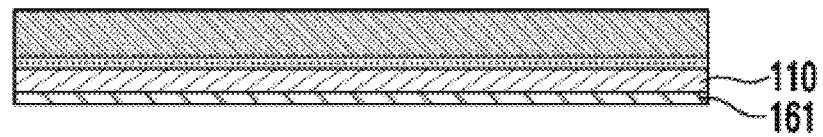

At the step of forming the lower metal seed layer (S320), as shown in FIG. 10B, before the metal layer patterning step (S340), the lower metal seed layer 161 for electroplating the EMI shielding layer 150 is formed on a bottom surface of the substrate 110. The lower metal seed layer 161 may be made of a silver (Ag) material having high electrical conductivity and may be formed by gravure coating, screen printing, slot die coating, spin coating or deposition.

Figure 10C:
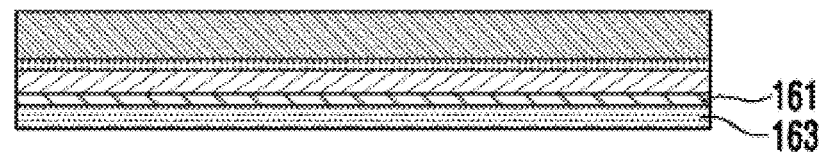

At the step of forming the lower protective film (S330), as shown in FIG. 10C, the lower protective film 163 is laminated under the lower metal seed layer 161.

Figure 10D:
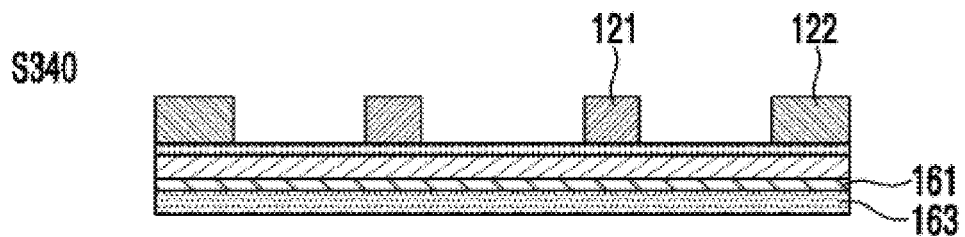

At the step of forming the signal unit and the ground unit (S340), as shown in FIG. 10D, in order to form the signal unit 121 and the ground unit 122 from the metal layer 120, the metal layer 120 is patterned by a photolithography process. In this way, a plurality of signal units 121 and ground units 122 can be formed. Here, since the lower metal seed layer 161 is covered by the lower protective film 163, the lower metal seed layer 161 can be inhibited from being damaged during patterning.

Figure 10E:
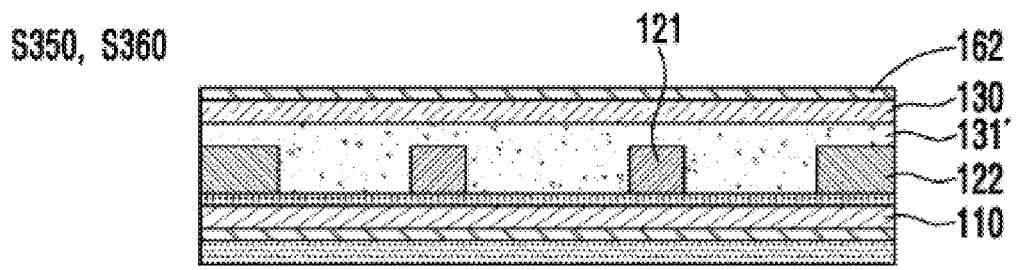

At the step of forming the insulation layer (S350), as shown in FIG. 10E, the insulation layer 130 is adhered to the top surface of the substrate 110 using an adhesive 131' in the form of, e.g., a bonding sheet. The adhesive 131' may be applied between the insulation layer 130 and the substrate 110 by hot pressing.

At the step of forming the upper metal seed layer (S360), the upper metal seed layer 162 for electroplating the EMI shielding layer 150 is formed on a top surface of the insulation layer 130. The upper metal seed layer 162 may be made of a silver (Ag) material having high electrical conductivity and may be formed by gravure coating, screen printing, slot die coating, spin coating or deposition.

Meanwhile, for simplifying the process, this embodiment of the present disclosure has been described by way of example with regard to a case where a flexible seed clad laminate (FSCL) having the metal seed layer 162 formed on the top surface of the insulation layer 130 is prepared in advance, the insulation layer 130 of the FSCL is bonded to the substrate 110 using the adhesive 131' in the form of, e.g., a bonding sheet, thereby simultaneously performing the insulation layer forming step (S350) and the upper metal seed layer forming step (S360), but aspects of the present disclosure are not limited thereto.

Figure 10F:
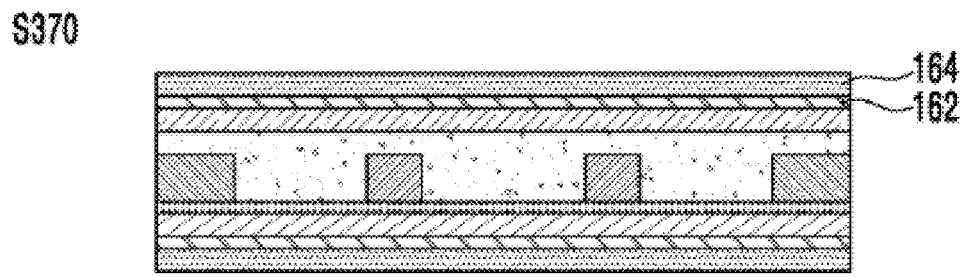

At the step of forming the upper protective film (S370), as shown in FIG. 10F, the upper protective film 164 is laminated on the upper metal seed layer 162.

Figure 11A:
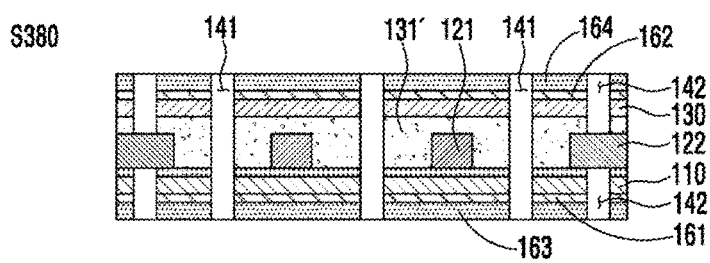

At the hole processing step (S380), as shown in FIG. 11A, a through hole 141 passing through the upper protective film 164, the upper metal seed layer 162, the insulation layer 130, the adhesive 131', the substrate 110, the lower metal seed layer 161 and the lower protective film 163 at opposite sides of the signal unit 121, is formed, and a contact hole 142 passing through the upper protective film 164, the upper metal seed layer 162, the insulation layer 130 and the adhesive 131' at a position corresponding to the ground unit 122 to expose the ground unit 122, is formed.

Here, the through hole 141 may include a plurality of through holes spaced apart from one another along the lengthwise direction of the signal unit 121, and a distance between the through holes 141 may be set to half or less of the wavelength of EMI generated from the signal unit 121. In addition, the distance between the through holes 141 may also be set such that the EMI absorbed into the EMI shielding layer 150 is smoothly discharged through the ground unit 122 in consideration of an electrical resistance value of the EMI shielding layer 150.

Meanwhile, this embodiment of the present disclosure has been described by way of example with regard to a case where the contact hole 142 is formed to a depth in which surfaces of the ground unit 122 are exposed from top and bottom portions, but aspects of the present disclosure are not limited thereto. For processing convenience, the contact hole 142 may also be formed to a depth so as to completely pass through the printed circuit board, including the ground unit 122. In order to inhibit the ground unit 122 from being damaged, it is also possible to expose side surfaces of the ground unit 122 within the contact hole 142 by adjusting the position of the contact hole 142.

Figure 11B:
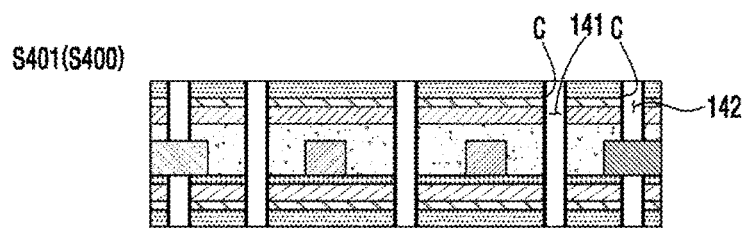
Figure 11C:
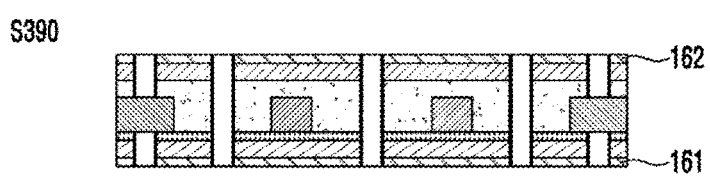
Figure 11D:
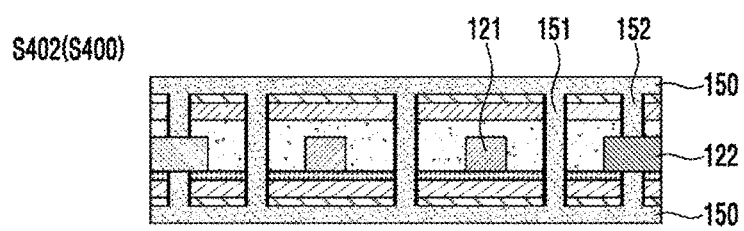
Figure 11E:
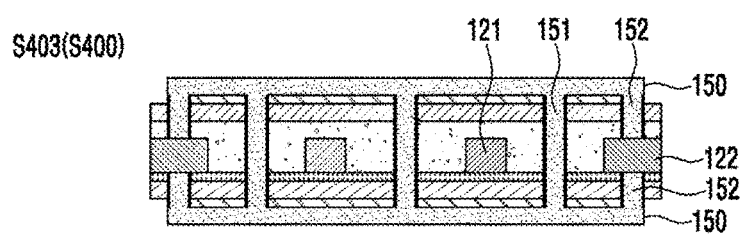

The step of forming the EMI shielding layer (S400) comprises the steps of: forming a metal seed film (C) on inner walls of the through hole 141 and the contact hole 142 (S401), as shown in FIG. 11B; plating a conductive material, such as copper (Cu), on the upper metal seed layer 162, the lower metal seed layer 161 and the metal seed film (C) (S402), as shown in FIG. 11C; and patterning the conductive material for removing the EMI shielding layer 150 and the metal seed layers 161 and 162, which are formed at unnecessary portions (S403), as shown in FIG. 11E.

At the step of forming the metal seed film (C) (S401), as shown in FIG. 11B, the metal seed film (C) may be formed on inner walls of the through hole 141 and the contact hole 142 by a black hole process, electroless plating, screen printing. At the step of plating the conductive material (S402), as shown in FIG. 11D, the EMI shielding layer 150 having a desired thickness is formed on surfaces of the upper metal seed layer 162 and the lower metal seed layer 161 by electroplating, the through hole 141 and the contact hole 142 having the metal seed film (C) formed therein are filled with a conductive material, thereby forming the shielding bridge 151 and the ground bridge 152.

Meanwhile, this embodiment of the present disclosure has been described by way of example with regard to a case where in order to form the EMI shielding layer 150, the metal seed layers 161 and 162 and the metal seed film (C) are first formed by electroless plating and the EMI shielding layer 150, the shielding bridge 151 and the ground bridge 152 are then formed using an electroplating process, but aspects of the present disclosure are not limited thereto. Alternatively, after the hole process (S260), it is also possible to form the EMI shielding layer 150, the shielding bridge 151 and the ground bridge 152 by forming an electroless plating on the entire external surface of the printed circuit board using an electroless plating process.

At the step of removing the protective film (S390), as shown in FIG. 11C, the upper protective film 164 disposed on the upper metal seed layer 162 and the lower protective film 163 disposed under lower metal seed layer 161 are removed between the metal seed layer forming step (S401) and the conductive material plating step (S402).

Figure 11F:
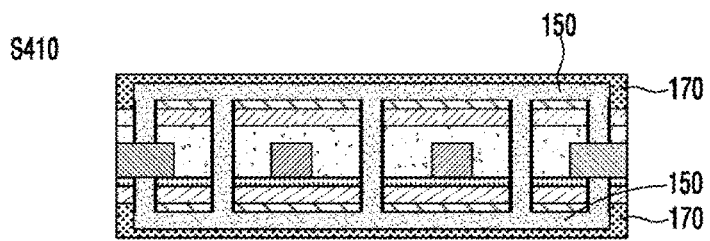

At the step of forming the cover layer (S410), as shown in FIG. 11F, in order to protect the EMI shielding layer 150, the cover layer 170 made of an insulating material is laminated on a top surface of the upper EMI shielding layer 150 and a bottom surface of the lower EMI shielding layer 150, respectively.

FIGS. 12A-12G and FIGS. 13A-13E illustrate cross-sectional views of various processing steps in a method for manufacturing a printed circuit board having an EMI shielding function according to a fourth embodiment of the present disclosure.

As shown in FIGS. 12A-12G and FIGS. 13A-13E, the method for manufacturing a printed circuit board having an EMI shielding function according to the fourth embodiment of the present disclosure comprises the steps of: forming a metal seed layer (S510); laminating a lower protective film (S520); forming a metal layer (S530); forming a signal unit and a ground unit (S540); forming an insulation layer (S550); forming an upper metal seed layer (S560); forming an upper protective film (S570); hole processing (S580); removing the upper and lower protective films (S590); forming an EMI shielding layer (S600); and forming a cover layer (S610).

Figure 12A:
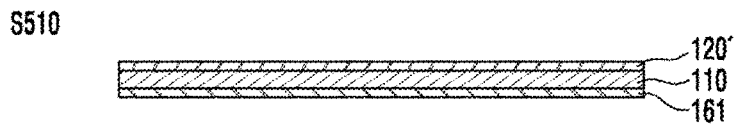
FIGS. 12A-12G and FIGS. 13A-13E illustrate cross-sectional views of various processing steps in a method for manufacturing a printed circuit board having an EMI shielding function according to a fourth embodiment of the present disclosure.

At the step of forming the metal seed layer (S510), as shown in FIG. 12A, a metal seed layer 120' for electroplating the metal layer 120 is formed on a top surface of an easily bendable insulating substrate 110 made of, e.g., polyimide, and a lower metal seed layer 161 for electroplating the EMI shielding layer 150 is formed on a bottom surface of the substrate 110. The metal seed layers 120' and 161 may be made of a silver (Ag) material having high electrical conductivity and may be formed by gravure coating, screen printing, slot die coating, spin coating or deposition.

Figure 12B:
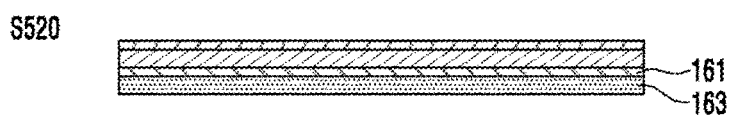

At the step of forming the lower protective film (S520), as shown in FIG. 12B, the lower protective film 163 is laminated under the lower metal seed layer 161.

Figure 12C:
Figure 12D:
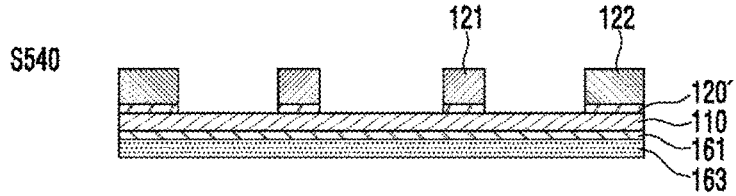
Figure 12E:
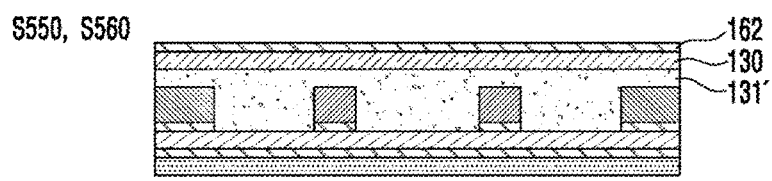
Figure 12F:
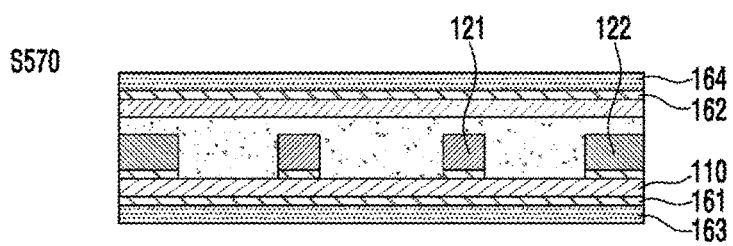
Figure 12G:
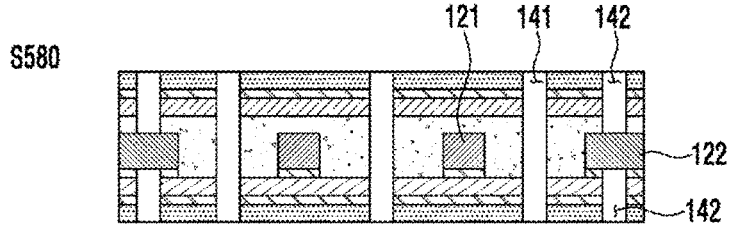
Figure 13A:
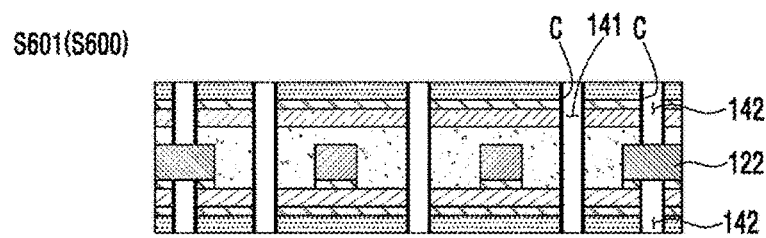
Figure 13B:
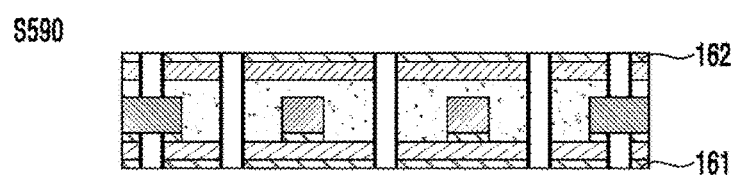
Figure 13C:
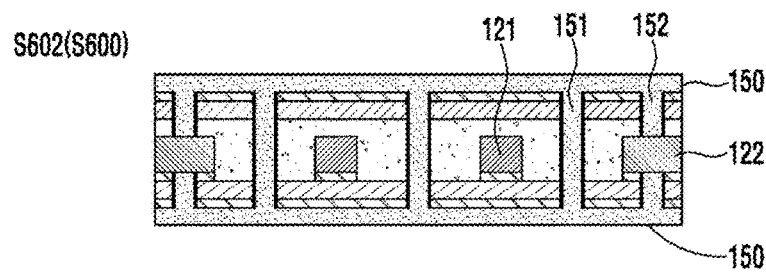
Figure 13D:
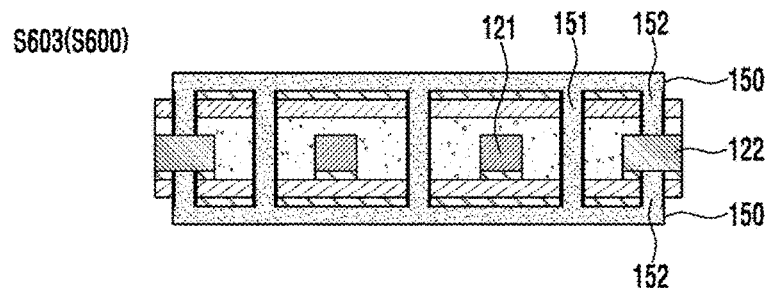
Figure 13E:
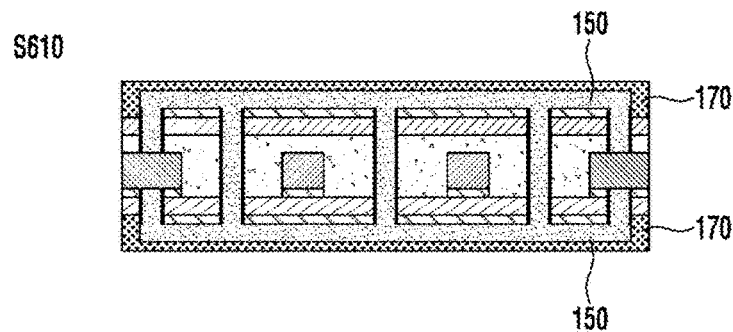

At the step of forming the metal layer (S530), as shown in FIG. 12C, the metal layer 120 is formed by electroplating a conductive material, such as copper (Cu), on the metal seed layer 120' formed on the top surface of the substrate 110. Here, since the lower metal seed layer 161 is covered by the lower protective film 163, the lower metal seed layer 161 can be inhibited from being plated with a conductive material during electroplating of the metal layer 120.

Meanwhile, various steps of this embodiment of the present disclosure shown in FIGS. 12D to 12G and FIGS. 13A to 13E, that is, the signal unit and ground unit forming step (S540), the insulation layer forming step (S550), the upper metal seed layer forming step (S560), the upper protective film forming step (S570), the hole processing step (S580), the upper and lower protective film removing step (S590), the EMI shielding layer forming step (S600) and the cover layer laminating step (S610), are substantially the same with those of the third embodiment, and detailed descriptions thereof will not be given.

FIGS. 14A-14H illustrate cross-sectional views of various processing steps in a method for manufacturing a printed circuit board having an EMI shielding function according to a fifth embodiment of the present disclosure.

As shown in FIGS. 14A-14H, the method for manufacturing the printed circuit board having an EMI shielding function according to the fifth embodiment of the present disclosure comprises the steps of: forming a signal unit and a ground unit (S710), forming an insulation layer (S720), hole processing (S730), forming an EMI shielding layer (S740) and laminating a cover layer (S750).

Figure 14A:
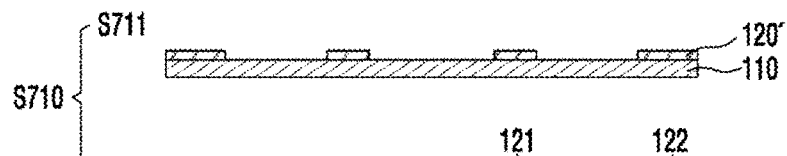
FIGS. 14A-14H illustrate cross-sectional views of various processing steps in a method for manufacturing a printed circuit board having an EMI shielding function according to a fifth embodiment of the present disclosure.
Figure 14B:
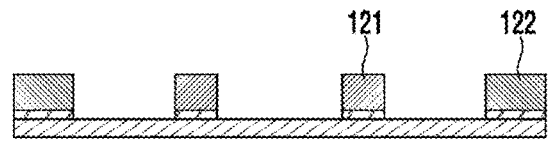

The step of forming the signal unit and the ground unit (S710) comprises the steps of: printing a metal seed layer 120' in the shape corresponding to the signal unit 121 and the ground unit 122 on a top surface of the substrate 110 (S711), as shown in FIG. 14A; and plating a metal layer 120 on the metal seed layer 120' (S712), as shown in FIG. 14B.

At the step of printing the metal seed layer (S711), as shown in FIG. 14A, a conductive paste including, for example, silver (Ag), is printed on a top surface of the substrate 110 by a printing process, such as rotary screen printing or roll-to-roll (R2R) flexographic printing, thereby forming the metal seed layer 120' shaped to correspond to the signal unit 121 and the ground unit 122.

At the step of plating the metal layer (S712), as shown in FIG. 14B, the metal layer 120 is formed by electroplating a conductive material, such as copper (Cu), on the metal seed layer 120' formed on the top surface of the substrate 110. Here, since the metal seed layer 120' is shaped to correspond to the signal unit 121 and the ground unit 122, the signal unit 121 and the ground unit 122 are formed by the metal layer electroplated on the metal seed layer 120'.

Figure 14C:
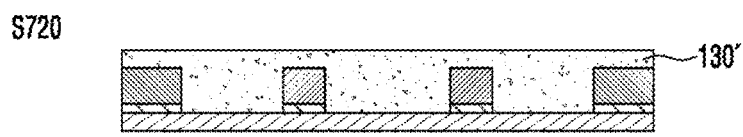

At the step of forming the insulation layer (S720), as shown in FIG. 14C, in order to protect the signal unit 121 and the ground unit 122 formed on the top surface of the substrate 110, the insulation layer 130' made of an insulating coating material is laminated on the top surface of the substrate 110 having the signal unit 121 and the ground unit 122 formed thereon.

Figure 14D:
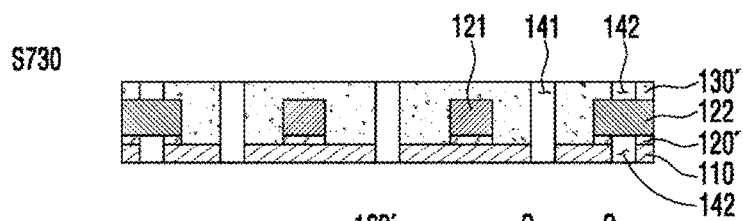

At the hole processing step (S730), as shown in FIG. 14D, a through hole 141 passing through the insulation layer 130' and the substrate 110 at opposite sides of the signal unit 121, is formed, a contact hole 142 passing through the insulation layer 130' at a position corresponding to the ground unit 122 to expose the ground unit 122, and a contact hole 142 passing through the substrate 110 and the metal seed layer 120', are formed.

Here, the through hole 141 may include a plurality of through holes formed along the lengthwise direction of the signal unit 121, and a distance between the through holes 141 may be set to half or less of the wavelength of EMI generated from the signal unit 121. In addition, a distance between contact holes 142 may also be set such that the EMI absorbed into the EMI shielding layer 150 is smoothly discharged through ground unit 122 in consideration of an electrical resistance value of the EMI shielding layer 150.

Meanwhile, in a case where the distance between the contact holes 142 is set to be equal to the distance between the through holes 141, a ground bridge 152 filling the contact hole 142 may function as a shielding bridge 151, the through hole 141 and the shielding bridge 151, which are disposed between the signal unit 121 and the ground unit 122, may not be formed.

Meanwhile, this embodiment of the present disclosure has been described by way of example with regard to a case where the contact hole 142 passes through the ground unit 122, but aspects of the present disclosure are not limited thereto. Alternatively, it is also possible to form the contact hole 142 such that the contact hole 142 is extended to a position where external surfaces of the ground unit 122 are exposed by etching or laser drilling. Additionally, it is also possible to minimize damages of the ground unit 122 by adjusting the position of the contact hole 142 so as to expose side surfaces of the ground unit 122.

Figure 14E:
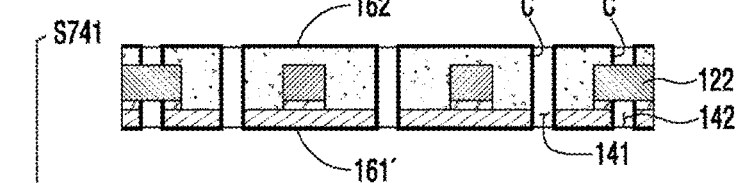
Figure 14F:
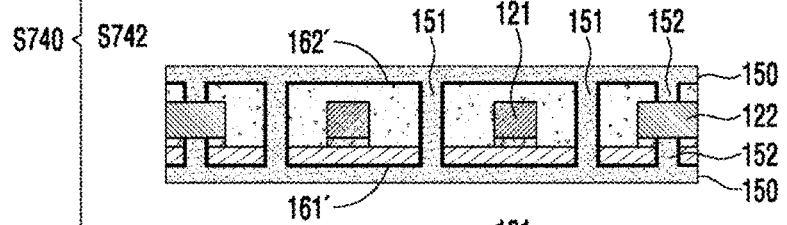
Figure 14G:
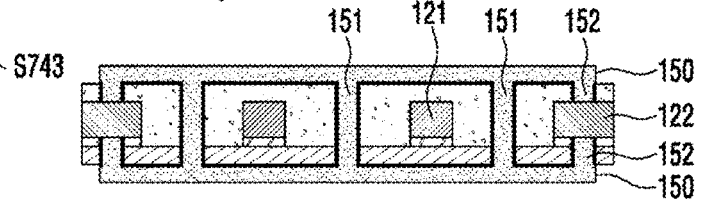

The step of forming the EMI shielding layer (S740) comprises the steps of: forming an upper metal seed layer 162' on the insulation layer 130', a lower metal seed layer 161' under the substrate 110, and a metal seed film (C) on inner walls of the through hole 141 and the contact hole 142 (S741), as shown in FIG. 14E; plating a conductive material, such as copper (Cu), on the upper metal seed layer 162', the lower metal seed layer 161' and the metal seed film (C) (S742), as shown in FIG. 14F; and patterning for removing the EMI shielding layer 150 and the metal seed layers 161' and 162', which are formed at unnecessary portions (S743), as shown in FIG. 14G. The removing can be performed by employing any of a variety of metal removing methods known in the related art. For example, the removing may be performed using a masking tape, but aspects of the present disclosure are not limited thereto.

At the step of forming the upper metal seed layer 162', the lower metal seed layer 161' and the metal seed film (C) (S741), as shown in FIG. 14E, the upper metal seed layer 162' and the lower metal seed layer 161' are formed on the top and bottom surfaces of the insulation layer 130', respectively, by a black hole process, electroless plating, or screen printing, and the metal seed film (C) is formed on the inner walls of the through hole 141 and the contact hole 142. Here, it is desirable to attach a masking tape in advance to portions needed to be protected from a plated material during electroless plating of the metal seed film (C), such as, for example, connectors provided at opposite ends of the printed circuit board, to then be removed after the electroless plating is finished.

At the step of plating the conductive material (S742), as shown in FIG. 14F, the EMI shielding layer 150 having a desired thickness is formed on surfaces of the metal seed film (C) formed on the top surface of the insulation layer 130' and the bottom surface of the substrate 110 by electroplating, and the through hole 141 and the contact hole 142 having the metal seed film (C) formed therein are filled with a conductive material, thereby forming the shielding bridge 151 and the ground bridge 152.

Figure 14H:
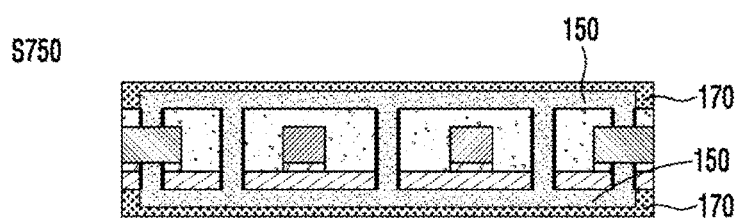

At the step of laminating the cover layer (S750), as shown in FIG. 14H, in order to protect the EMI shielding layer 150, the cover layer 170 made of an insulating material is laminated on a top surface of the upper EMI shielding layer 150 and a bottom surface of the lower EMI shielding layer 150, respectively.

FIGS. 15A-15F illustrate cross-sectional views of various processing steps in a method for manufacturing a printed circuit board having an EMI shielding function according to a sixth embodiment of the present disclosure.

As shown in FIGS. 15A-15F, the method for manufacturing a printed circuit board having an EMI shielding function according to the sixth embodiment of the present disclosure comprises the steps of: forming a metal layer (S810); forming a signal unit and a ground unit (S820); forming an insulation layer (S830); hole processing (S840); forming an EMI shielding layer (S850); and laminating a cover layer (S860).

Figure 15A:
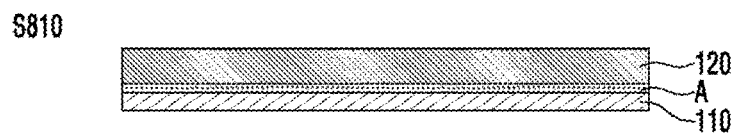
FIGS. 15A-15F illustrate cross-sectional views of various processing steps in a method for manufacturing a printed circuit board having an EMI shielding function according to a sixth embodiment of the present disclosure.

At the step of forming the metal layer (S810), as shown in FIG. 15A, the metal layer 120 made of, e.g., copper (Cu), is laminated on an easily bendable insulating substrate 110 made of, e.g., polyimide. The step of forming the metal layer (S810) may be replaced by a step of preparing a flexible copper cladding laminate (FCCL) provided in a state in which the metal layer 120 is laminated on a top surface of the substrate 110 using a thermally curable adhesive (A). In this way, the metal layer 120 may be provided by laminating the same on the substrate 110. Alternatively, the metal layer 120 may be provided by coating a metal on the substrate 110 or by plating the metal layer 120 on the substrate 110.

Figure 15B:
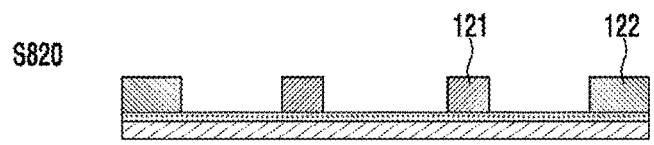
Figure 15C:
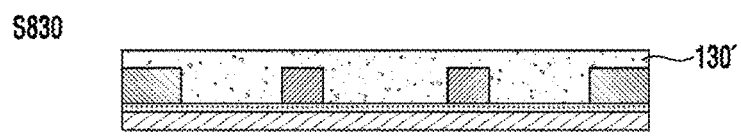
Figure 15D:
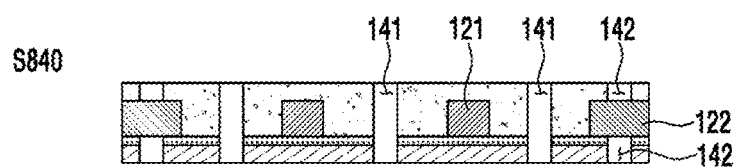
Figure 15E:
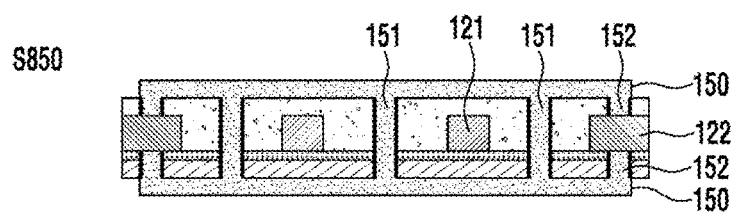
Figure 15F:
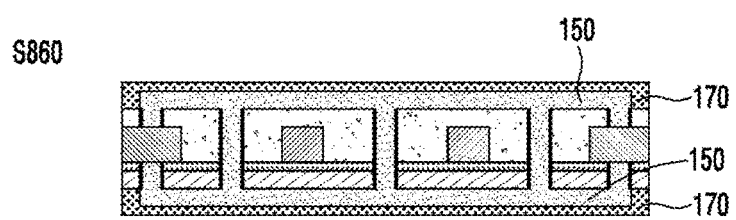

At the step of forming the signal unit and the ground unit (S820), as shown in FIG. 15B, in order to form the signal unit 121 and the ground unit 122 from the metal layer 120, the metal layer 120 is patterned by a photolithography process. In this way, a plurality of signal units 121 and ground units 122 can be formed.

Since various steps of this embodiment of the present disclosure shown in FIGS. 15C to 15F, that is, the insulation layer forming step (S830), the hole processing step (S840), the EMI shielding layer forming step (S850) and the cover layer laminating step (S860), are substantially the same with those of the fifth embodiment, detailed descriptions thereof will not be given.

As described above, according to the present disclosure, since the shielding bridges 151 disposed at opposite sides of the signal unit 121 are spaced apart from each other by a distance smaller than or equal to half of the wavelength of EMI generated from the signal unit 121, the EMI generated from the signal unit 121 cannot pass a space between the opposite-side shielding bridges 151, thereby providing a Faraday cage effect, unlike in the conventional related art in which each signal unit 121 is actually wrapped using a metallic shielding can, as if the signal unit 121 were packaged with a metallic material. In other words, unlike the conventional shielding can existing as a substance and entirely wrapping around the signal unit 121, the shielding bridges 151 disposed at opposite sides of the signal unit 121 are capable of forming imaginary EMI shielding films having only invisible electrical properties and performing an EMI shielding function while enclosing the signal unit 121. Accordingly, the same EMI shielding effect as in the case of enclosing each signal unit 121 can be provided simply by laminating the EMI shielding layer 150 only on top and bottom portions of the signal unit 121.

FIGS. 16A-16H illustrate cross-sectional views of various processing steps in a method for manufacturing a printed circuit board having an EMI shielding function according to a seventh embodiment of the present disclosure.

As shown in FIGS. 16A-16H, the method for manufacturing a printed circuit board having an EMI shielding function according to the seventh embodiment of the present disclosure comprises the steps of: forming a metal layer (S910); forming a signal unit and a ground unit (S920); forming an insulation layer (S930); hole processing (S940); attaching a masking tape (S950); forming an EMI shielding layer (S960); removing the masking tape (S970); and laminating a cover layer (S980).

Figure 16A:
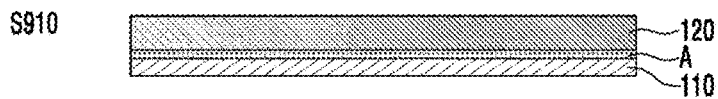
FIGS. 16A-16H illustrate cross-sectional views of various processing steps in a method for manufacturing a printed circuit board having an EMI shielding function according to a seventh embodiment of the present disclosure.

At the step of forming the metal layer (S910), as shown in FIG. 16A, the metal layer 120 made of, e.g., copper (Cu), is laminated on an easily bendable insulating substrate 110 made of, e.g., polyimide. The step of forming the metal layer (S910) may be replaced by a step of preparing a flexible copper cladding laminate (FCCL) provided in a state in which the metal layer 120 is laminated on a top surface of the substrate 110 using a thermally curable adhesive (A). In this way, the metal layer 120 may be provided by laminating the same on the substrate 110. Alternatively, the metal layer 120 may be provided by coating a metal on the substrate 110 or by plating the metal layer 120 on the substrate 110.

Figure 16B:
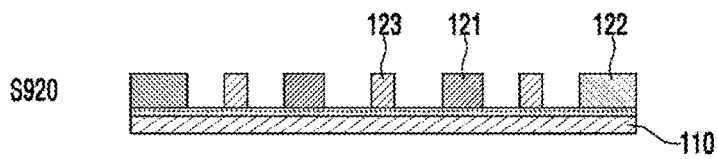

At the step of forming the signal unit and the ground unit (S920), as shown in FIG. 16B, the metal layer 120 is patterned by a photolithography process. In this way, a plurality of signal units 121 and ground units 122 are formed on the top surface of the substrate 110, and a pillar-shaped post 123 is formed at opposite sides of each signal unit 121. The post 123 includes a plurality of posts formed and spaced apart from each other along the lengthwise direction of the signal unit 121. A distance between the plurality of posts 123 is set to half or less of the wavelength of EMI generated from the signal unit 121.

Figure 16C:
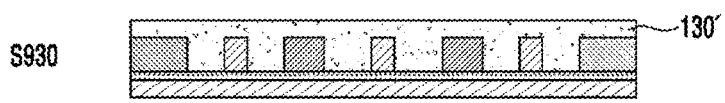

At the step of forming the insulation layer (S930), as shown in FIG. 16C, in order to protect the signal unit 121 and the ground unit 122 formed on the top surface of the substrate 110, the insulation layer 130' made of an insulating coating material is laminated on the top surface of the substrate 110 having the signal unit 121, the ground unit 122 and the post 123 formed thereon.

Figure 16D:
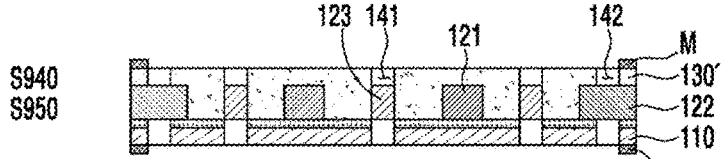

At the hole processing step (S940), as shown in FIG. 16D, a through hole 141 passing through the insulation layer 130' and the substrate 110 at a position corresponding to the post 123, is formed to expose top and bottom surfaces of the post 123, and a contact hole 142 passing through the insulation layer 130' and the substrate 110 at a position corresponding to the ground unit 122 to expose top and bottom surfaces of the ground unit 122.

At the masking tape attaching step (S950), the masking tape M is attached in advance to portions needed to be protected from a plated material during plating of the EMI shielding layer forming step (S960). The masking tape M preferably has an appropriate adhesion force enough to be easily removed after the plating is finished without being released unwantedly in the course of plating.

Figure 16E:
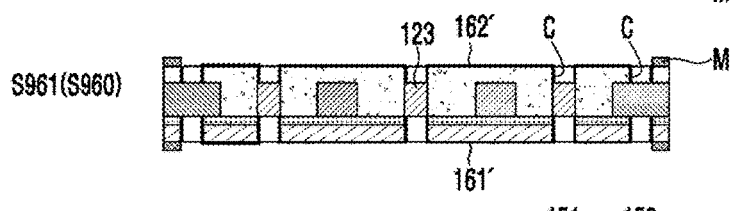
Figure 16F:
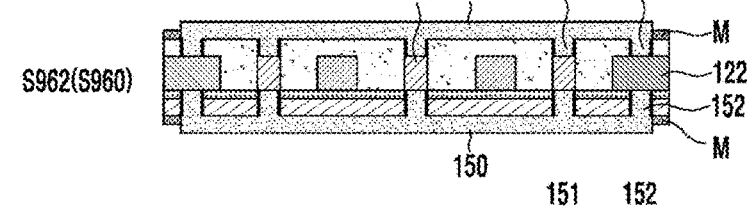

The step of forming the EMI shielding layer (S960) comprises the steps of: forming an upper metal seed layer 162' and a lower metal seed layer 161' on the insulation layer 130' and under the substrate 110, respectively, and forming a metal seed film (C) on inner walls of the through hole 141 and the contact hole 142 (S961), as shown in FIG. 16E; and plating a conductive material, such as copper (Cu), on the upper metal seed layer 162', the lower metal seed layer 161' and the metal seed film (C) (S962), as shown in FIG. 16F.

At the step of forming the upper metal seed layer, the lower metal seed layer and the metal seed film (C) (S961), as shown in FIG. 16E, the upper metal seed layer 162' is formed on a top surface of the insulation layer 130', the lower metal seed layer 161' is formed on the bottom surface of the substrate 110, and the metal seed film (C) is formed on inner walls of the through hole 141 and the contact hole 142, by a black hole process, electroless plating, screen printing.

At the step of plating a conductive material (S962), as shown in FIG. 16F, the EMI shielding layer 150 having a desired thickness is formed on surfaces of the upper metal seed layer 162' formed the top surface of the insulation layer 130' and the lower metal seed layer 161' formed on the bottom surface of the substrate 110 by electroplating, and the through hole 141 and the contact hole 142 having the metal seed film (C) formed therein are filled with the conductive material, thereby forming the shielding bridge 151 and the ground bridge 152. Here, the through hole 141 is not configured to completely pass through the printed circuit board but is formed at top and bottom portions of the post 123, respectively. Therefore, an incomplete filling problem with the through hole 141 plated with the conductive material can be effectively ameliorated.

Figure 16G:

At the step of removing the masking tape (S970), as shown in FIG. 16G, the masking tape M adhered to the top surface of the insulation layer 130' and the bottom surface of the substrate 110 is removed.

Figure 16H:
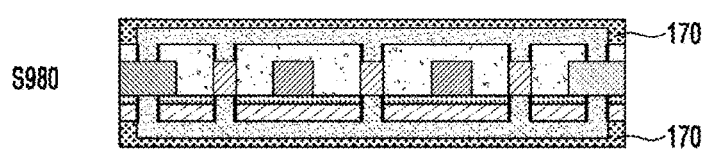

At the step of laminating the cover layer (S980), as shown in FIG. 16H, the cover layer 170 made of an insulating material is laminated on a top surface of the upper EMI shielding layer 150 and a bottom surface of the lower EMI shielding layer 150, respectively.

Meanwhile, the aforementioned embodiment of the present disclosure has been described by way of example with regard to a case where the substrate is employed to a flexible printed circuit board having a flexible substrate, but aspects of the present disclosure are not limited thereto. Alternatively, it is also possible to employ the substrate to a rigid printed circuit board having a rigid substrate.

While the present disclosure has been particularly shown and described with reference to several example embodiments thereof, it will be understood by those of ordinary skill in the art that various changes in form and details may be made therein without departing from the spirit and scope of the present disclosure as defined by the present disclosure.

DESCRIPTION OF REFERENCE NUMERALS IN THE DRAWINGS

| | |
|---|---|
| 110: Substrate | 120: Metal layer |
| 120': Metal seed layer | 121: Signal unit |
| 122: Ground unit | 130: Insulation layer |
| 131: Adhesive | 141: Through hole |
| 142: Contact hole | 150: EMI shielding layer |
| 151: Shielding bridge | 152: Ground bridge |
| 161: Lower metal seed layer | 162: Upper metal seed layer |
| 163: Lower protective film | 164: Upper protective film |
| A: Thermally curable adhesive | C: Metal seed film |

The invention claimed is:

1. A printed circuit board having an EMI shielding function, the printed circuit board comprising:
   a substrate;
   a signal unit disposed on the substrate;
   a ground unit disposed in parallel with the signal unit;
   an insulation layer disposed on the substrate and covering the signal unit and the ground unit;
   an EMI shielding layer disposed above the insulation layer and under the substrate, respectively; and
   a shielding bridge passing through the substrate and the insulation layer at opposite sides of the signal unit and electrically connecting the EMI shielding layer disposed on the insulation layer to the EMI shielding layer disposed under the substrate.

2. The printed circuit board according to claim 1, further comprising a ground bridge electrically connecting the EMI shielding layer and the ground unit to each other.

3. The printed circuit board according to claim 2, wherein the ground bridge is formed at at least one of the insulation layer and the substrate.

4. The printed circuit board according to claim 2, wherein the ground bridge is formed at connectors provided at opposite ends of the printed circuit board and connected to the signal unit and the ground unit, respectively.

5. The printed circuit board according to claim 2, wherein the ground bridge is formed in a contact hole passing through at least one of the insulation layer and the substrate so as to expose the ground unit.

6. The printed circuit board according to claim 1, wherein the shielding bridge includes a plurality of shielding bridges spaced apart from each other along the lengthwise direction of the signal unit.

7. The printed circuit board according to claim 6, wherein a distance between the spaced-apart shielding bridges is set to half or less of the wavelength of EMI generated from the signal unit.

8. The printed circuit board according to claim 6, wherein a distance between the spaced-apart shielding bridges is set to half or less of the wavelength of externally applied EMI.

9. The printed circuit board according to claim 6, wherein the shielding bridge is formed in a through hole passing through the substrate and the insulation layer.

10. The printed circuit board according to claim 6, wherein the ground unit is disposed at opposite edges of a top surface of the substrate.

11. The printed circuit board according to claim 1, wherein the EMI shielding layer is in the form of a mesh.

12. The printed circuit board according to claim 11, wherein a diagonal length of the grid in the mesh is set to half or less of the wavelength of EMI generated from the signal unit.

13. The printed circuit board according to claim 11, wherein a diagonal length of the grid in the mesh is set to half or less of the wavelength of externally applied EMI.

14. A flat cable comprising:
   a printed circuit board having an EMI shielding function, the printed circuit board including a substrate, a signal unit disposed on the substrate, a ground unit disposed in parallel with the signal unit, an insulation layer disposed above the substrate and covering the signal unit and the ground unit, an EMI shielding layer disposed on the insulation layer and under the substrate, respectively, and a shielding bridge passing through the substrate and the insulation layer at opposite sides of the signal unit and electrically connecting the EMI shielding layer disposed on the insulation layer to the EMI shielding layer disposed under the substrate; and
   connectors provided at opposite ends of the printed circuit board and connected to the signal unit and the ground unit, respectively.

15. The flat cable according to claim 14, wherein the printed circuit board further comprises a ground bridge electrically connecting the EMI shielding layer and the ground unit to each other.

16. The flat cable according to claim 14, wherein the shielding bridge includes a plurality of shielding bridges spaced apart from each other along the lengthwise direction of the signal unit.

17. The flat cable according to claim 16, wherein a distance between the spaced-apart shielding bridges is set to half or less of the wavelength of EMI generated from the signal unit.

18. The flat cable according to claim 16, wherein a distance between the spaced-apart shielding bridges is set to half or less of the wavelength of externally applied EMI.

* * * * *